(12) United States Patent
Tsuchihashi et al.

(10) Patent No.: US 10,639,683 B2
(45) Date of Patent: May 5, 2020

(54) RECOVERY PIPING CLEANING METHOD AND SUBSTRATE PROCESSING APPARATUS

(71) Applicant: SCREEN Holdings Co., Ltd., Kyoto (JP)

(72) Inventors: Yuya Tsuchihashi, Kyoto (JP); Atsuyasu Miura, Kyoto (JP); Hiroki Tsujikawa, Kyoto (JP); Kazuhiro Fujita, Kyoto (JP); Masahide Ikeda, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 168 days.

(21) Appl. No.: 15/709,533

(22) Filed: Sep. 20, 2017

(65) Prior Publication Data

US 2018/0085795 A1 Mar. 29, 2018

(30) Foreign Application Priority Data

Sep. 26, 2016 (JP) ................................ 2016-187139

(51) Int. Cl.
| | |
|---|---|
| *B08B 9/032* | (2006.01) |
| *B08B 9/027* | (2006.01) |
| *H01L 21/67* | (2006.01) |
| *B08B 3/08* | (2006.01) |
| *B08B 3/10* | (2006.01) |

(52) U.S. Cl.
CPC ............ *B08B 9/0321* (2013.01); *B08B 9/027* (2013.01); *H01L 21/67023* (2013.01); *B08B 3/08* (2013.01); *B08B 3/10* (2013.01); *B08B 9/0325* (2013.01)

(58) Field of Classification Search
CPC .......... H01L 21/67023; H01L 21/6708; H01L 21/67051
See application file for complete search history.

(56) References Cited

U.S. PATENT DOCUMENTS

| | | | |
|---|---|---|---|
| 2008/0142051 A1 | 6/2008 | Hashizume | 134/23 |
| 2010/0108103 A1 | 5/2010 | Minami et al. | 134/26 |

(Continued)

FOREIGN PATENT DOCUMENTS

| | | |
|---|---|---|
| JP | 2001-271188 A | 10/2001 |
| JP | 2004-267965 A | 9/2004 |

(Continued)

*Primary Examiner* — Mikhail Kornakov
*Assistant Examiner* — Natasha N Campbell
(74) *Attorney, Agent, or Firm* — Ostrolenk Faber LLP

(57) ABSTRACT

A recover piping cleaning method is a method of cleaning a recovery piping into which a chemical liquid used for processing of a substrate is led via a processing cup, the recovery piping being arranged to lead the led chemical liquid into a predetermined chemical liquid recovery piping, the method including a piping cleaning step of cleaning the interior of the recovery piping by using a cleaning liquid by, while supplying the cleaning liquid to the recovery piping, leading the liquid led into the recovery piping into a drain piping which is different from the chemical liquid recovery piping, and a cleaning chemical liquid supplying step of, supplying the cleaning chemical liquid from a cleaning chemical liquid supply piping connected to the recovery piping to the recovery piping while leading the liquid led into the recovery piping into the drain piping.

8 Claims, 10 Drawing Sheets

(56) References Cited

U.S. PATENT DOCUMENTS

2017/0256426 A1* 9/2017 Iwao ................. B05B 15/60
2017/0335458 A1  11/2017 Murata et al.

FOREIGN PATENT DOCUMENTS

| JP | 2007-149891 A | 6/2007 |
| JP | 2010-135756 A | 6/2010 |
| JP | 2016-063074 A | 4/2016 |
| WO | WO 2016/096227 A1 | 6/2016 |
| WO | WO 2016/130744 A1 | 8/2016 |
| WO | WO 2016/135876 A1 | 9/2016 |

* cited by examiner

RECOVERY PIPING CLEANING METHOD AND SUBSTRATE PROCESSING APPARATUS

BACKGROUND OF THE INVENTION

1. Field of the Invention

The present invention relates to a recovery piping cleaning method of cleaning a recovery piping into which a chemical liquid received by a processing cup is led, and a substrate processing apparatus in which such a recovery piping cleaning method is executed. Examples of substrates to be processed include semiconductor wafers, substrates for liquid crystal display devices, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

US Unexamined Patent Application Publication No. 2008/142051 A1 discloses a single substrate processing type substrate processing apparatus that processes substrates one at a time. A processing unit of the substrate processing apparatus includes a spin chuck that horizontally holds and rotates the substrate, chemical liquid nozzles that discharge a chemical liquid toward an upper surface of the substrate held by the spin chuck, and a cylindrical processing cup surrounding the spin chuck. In order to reduce the consumption amount of the chemical liquid, the processing unit is arranged to recover the chemical liquid already used for processing of the substrate so that the recovered chemical liquid can be reused in the subsequent processing. Specifically, the substrate processing apparatus further includes a chemical liquid tank storing the chemical liquid supplied to the chemical liquid nozzle, a recovery piping into which the chemical liquid received by the processing cup is led, and a chemical liquid recovery piping that leads the chemical liquid from the recovery piping to the chemical liquid tank.

US Unexamined Patent Application Publication No. 2008/142051 A1 proposes to clean an inner wall of the processing cup by using a cleaning liquid (cup cleaning) at a predetermined timing to remove an object attached to the inner wall in order to prevent or suppress supply of the chemical liquid crystallized on the inner wall of the processing cup and an inner wall of the recovery piping to the chemical liquid tank. However, in the cup cleaning, when the cleaning liquid is mixed into the chemical liquid reserved in the chemical liquid tank, the chemical liquid is diluted. As a result, there is a problem that a processing rate at the time of substrate processing is decreased. In order to avoid such a problem, US Unexamined Patent Application Publication No. 2008/142051 A1 adopts a method in which after cup cleaning, by supplying the chemical liquid to a dummy substrate in a rotated state, the chemical liquid is supplied to the inner wall of the processing cup, and thereby, the cleaning liquid attached to the inner wall of the processing cup and the cleaning liquid attached to the inner wall of the recovery piping are respectively replaced with a cleaning chemical liquid of the same type as the chemical liquid.

SUMMARY OF THE INVENTION

However, with the method described in US Unexamined Patent Application Publication No. 2008/142051 A1, in order to supply the cleaning chemical liquid to the processing cup, the cleaning chemical liquid is supplied to the substrate, etc., (the substrate or the dummy substrate) and the cleaning chemical liquid is scattered from a peripheral edge portion of the substrate. Thus, efficiency of supplying the cleaning chemical liquid to the processing cup is low.

Moreover, the present inventors consider that there is no need to replace the cleaning liquid attached to the inner wall of the processing cup with the cleaning chemical liquid, but by replacing only the cleaning liquid existing in the recovery piping with the cleaning chemical liquid, the effect of suppressing the decrease in the processing rate can be obtained.

That is, with the method described in US Unexamined Patent Application Publication No. 2008/142051 A1, there is a fear that the consumption amount of the cleaning chemical liquid is increased.

Reduction in the consumption amount of the cleaning chemical liquid (that is, the chemical liquid) is desired. In addition, dispersing the cleaning chemical liquid over a wide range in the recovery piping while reducing the consumption amount of the cleaning chemical liquid is desired.

Therefore, an object of the present invention is to provide a recovery piping cleaning method and a substrate processing apparatus with which the consumption amount of a cleaning chemical liquid can be reduced while preventing or suppressing entry of a cleaning liquid into a chemical liquid recovery piping.

Further, another object of the present invention is to provide a substrate processing apparatus with which a chemical liquid can be dispersed over a wide range in a recovery piping while reducing the consumption amount of the chemical liquid.

A first aspect of the present invention provides a recovery piping cleaning method of cleaning a recovery piping into which a chemical liquid used for processing of a substrate is led via a processing cup, the recovery piping being arranged to lead the chemical liquid into a predetermined chemical liquid recovery piping, including a piping cleaning step of cleaning the interior of the recovery piping by using a cleaning liquid by, while supplying the cleaning liquid to the recovery piping, leading the liquid led into the recovery piping into a drain piping which is different from the chemical liquid recovery piping, and a cleaning chemical liquid supplying step of, in order to replace the cleaning liquid existing in the recovery piping with a cleaning chemical liquid of the same type as the chemical liquid after the piping cleaning step, supplying the cleaning chemical liquid from a cleaning chemical liquid supply piping connected to the recovery piping to the recovery piping while leading the liquid led into the recovery piping into the drain piping.

With this method, the cleaning liquid used for cleaning of the interior of the recovery piping in the piping cleaning step is led from the recovery piping into the drain piping and drained. After the piping cleaning step, the cleaning chemical liquid from the cleaning chemical liquid supply piping is supplied to the recovery piping, and the cleaning liquid existing in the recovery piping is replaced with the cleaning chemical liquid. The cleaning chemical liquid containing the cleaning liquid is led into the drain piping. Thereby, it is possible to prevent or suppress entry of the cleaning liquid used for cleaning of the interior of the recovery piping into the chemical liquid recovery piping.

The cleaning chemical liquid from the cleaning chemical liquid supply piping is directly supplied to the recovery piping. Thus, in comparison to a case where the chemical liquid from a chemical liquid supplying unit is supplied to the recovery piping as the cleaning chemical liquid via the substrate, etc., (the substrate or a dummy substrate) and the processing cup, efficiency of supplying the cleaning chemical liquid to the recovery piping can be enhanced. As a result, an amount of the cleaning chemical liquid required to replace the cleaning chemical liquid can be reduced.

Thereby, the recovery piping cleaning method with which the consumption amount of the cleaning chemical liquid can be reduced while preventing or suppressing entry of the cleaning liquid into the chemical liquid recovery piping can be provided.

A second aspect of the present invention provides a substrate processing apparatus including a chemical liquid supplying unit arranged to supply a chemical liquid to be used for processing of a substrate to the substrate, a processing cup arranged to receive the chemical liquid supplied to the substrate, a recovery piping into which the chemical liquid received by the processing cup is led, a chemical liquid recovery piping arranged to recover the chemical liquid led into the recovery piping, a drain piping arranged to drain the liquid led into the recovery piping, a switching unit arranged to lead the liquid led into the recovery piping selectively into the chemical liquid recovery piping and the drain piping, a cleaning liquid supplying unit arranged to supply a cleaning liquid for cleaning the interior of the recovery piping, a cleaning chemical liquid supplying unit having a cleaning chemical liquid supply piping connected to the recovery piping, the cleaning chemical liquid supply piping being arranged to supply a cleaning chemical liquid of the same type as the chemical liquid to be recovered via the recovery piping to the recovery piping, and a controller arranged to control the chemical liquid supplying unit, the cleaning chemical liquid supplying unit, the switching unit, and the cleaning liquid supplying unit, wherein the controller executes a piping cleaning step of cleaning the interior of the recovery piping by using the cleaning liquid by, while supplying the cleaning liquid to the recovery piping, leading the liquid led into the recovery piping into the drain piping, and a cleaning chemical liquid supplying step of, in order to replace the cleaning liquid existing in the recovery piping with the cleaning chemical liquid after the piping cleaning step, supplying the cleaning chemical liquid from the cleaning chemical liquid supply piping to the recovery piping while leading the liquid led into the recovery piping into the drain piping.

With this arrangement, the cleaning liquid used for cleaning of the interior of the recovery piping in the piping cleaning step is led from the recovery piping into the drain piping and drained. After the piping cleaning step, the cleaning chemical liquid from the cleaning chemical liquid supply piping is supplied to the recovery piping, and the cleaning liquid existing in the recovery piping is replaced with the cleaning chemical liquid. The cleaning chemical liquid containing the cleaning liquid is led into the drain piping. Thereby, it is possible to prevent or suppress entry of the cleaning liquid used for cleaning of the interior of the recovery piping into the chemical liquid recovery piping.

The cleaning chemical liquid from the cleaning chemical liquid supply piping is directly supplied to the recovery piping. Thus, in comparison to the case where the chemical liquid from the chemical liquid supplying unit is supplied to the recovery piping as the cleaning chemical liquid via the substrate, etc., (the substrate or the dummy substrate) and the processing cup, the efficiency of supplying the cleaning chemical liquid to the recovery piping can be enhanced. As a result, the amount of the cleaning chemical liquid required to replace with the cleaning chemical liquid can be reduced.

Thereby, the substrate processing apparatus with which the consumption amount of the chemical liquid can be reduced while suppressing or preventing entry of the cleaning liquid into the chemical liquid recovery piping can be provided.

In one preferred embodiment of the present invention, the recovery piping may have an up-down direction portion connected to the processing cup, the up-down direction portion extending along the up-down direction, and a lateral direction portion connected to a lower end of the up-down direction portion, the lateral direction portion extending along the lateral direction. In this case, the cleaning chemical liquid supply piping may be connected to the lateral direction portion. The cleaning chemical liquid supplying unit supplies the cleaning chemical liquid to the lateral direction portion.

With this arrangement, the liquid existing in the up-down direction portion is moved toward the lateral direction portion due to the weight of the liquid. Therefore, when a predetermined period of time elapses from the end of the piping cleaning step, most of the cleaning liquid existing in the recovery piping exists in the lateral direction portion, and almost no cleaning liquid exists in the up-down direction portion.

With this arrangement, the cleaning chemical liquid from the cleaning chemical liquid supply piping is supplied to the lateral direction portion. Therefore, the cleaning chemical liquid is dispersed over the interior of a portion of the lateral direction portion on the further downstream side than a connection position of the cleaning chemical liquid supply piping. As described above, when a predetermined period of time elapses from the end of the piping cleaning step, almost no cleaning liquid exists in the up-down direction portion. Thus, by directly supplying the cleaning chemical liquid to the lateral direction portion, almost all of the cleaning liquid existing in the recovery piping can be replaced with the cleaning chemical liquid. In this case, length of a portion of the piping to be subjected to replacement with the cleaning chemical liquid is short. Thus, in comparison to a case where the cleaning liquid existing in both the up-down direction portion and the lateral direction portion is replaced with the cleaning chemical liquid, the amount of the cleaning chemical liquid (that is, the chemical liquid) used to replace with the cleaning chemical liquid can be furthermore reduced.

The recovery piping may include an up-down direction portion connected to the processing cup, the up-down direction portion extending along the up-down direction, and a lateral direction portion connected to a lower end of the up-down direction portion, the lateral direction portion extending along the lateral direction. In this case, the cleaning chemical liquid supply piping may be connected to the up-down direction portion, and the cleaning chemical liquid supplying unit may supply the chemical liquid to the up-down direction portion.

With this arrangement, the cleaning chemical liquid from the cleaning chemical liquid supply piping is supplied to the up-down direction portion. Therefore, the cleaning chemical liquid is dispersed over the entire region in the interior of a portion of the up-down direction portion on the further downstream side than a connection position of the cleaning chemical liquid supply piping and the lateral direction portion. Thereby, the cleaning liquid existing in the recovery piping can be replaced with the cleaning chemical liquid in a wide range in the recovery piping. Therefore, it is possible to prevent or more effectively suppress entry of the cleaning liquid into the chemical liquid recovery piping.

The up-down direction portion may have an upper end portion. In this case, the cleaning chemical liquid supply piping may be connected to the upper end portion of the up-down direction portion.

With this arrangement, the cleaning chemical liquid supply piping is connected to the upper end portion of the up-down direction portion. Thus, the cleaning chemical liquid from the cleaning chemical liquid supply piping can be supplied to the upper end portion of the up-down direction portion. Therefore, the cleaning chemical liquid can be dispersed over the entire region in the recovery piping. Thereby, the cleaning chemical liquid can be replaced in the entire region in the recovery piping. Therefore, it is possible to prevent or more effectively suppress entry of the cleaning liquid into the chemical liquid recovery piping.

The chemical liquid supplying unit may include a chemical liquid nozzle arranged to discharge the chemical liquid. The substrate processing apparatus may further include a container disposed out of the processing cup, the container being arranged to catch the chemical liquid discharged from the chemical liquid nozzle. The cleaning chemical liquid supply piping may include a connection piping connected to the recovery piping, the connection piping being arranged to supply the chemical liquid led into the container to the recovery piping as the cleaning chemical liquid.

With this arrangement, the chemical liquid discharged from the chemical liquid nozzle and received by the container passes through the connection piping and is supplied to the recovery piping as the cleaning chemical liquid. Thereby, the arrangement to directly supply the cleaning chemical liquid to the recovery piping can be realized with a simple arrangement.

The chemical liquid supplying unit may include a chemical liquid nozzle arranged to discharge the chemical liquid, and a chemical liquid piping arranged to supply the chemical liquid to the chemical liquid nozzle. In this case, the cleaning chemical liquid supply piping may include a branching piping connected to the recovery piping, the branching piping branching from the chemical liquid piping.

With this arrangement, the chemical liquid from the chemical liquid piping passes through the branching piping branching from the chemical liquid piping and is supplied to the recovery piping as the cleaning chemical liquid. Thereby, the arrangement to directly supply the cleaning chemical liquid to the recovery piping can be realized with a simple arrangement.

A third aspect of the present invention provides a substrate processing apparatus including a chemical liquid supplying unit arranged to supply a chemical liquid to be used for processing of a substrate to the substrate, a processing cup arranged to receive the chemical liquid supplied to the substrate, a container disposed out of the processing cup, the container being arranged to catch the chemical liquid discharged from a chemical liquid nozzle, a recovery piping into which the chemical liquid received by the processing cup is led, the recovery piping having an up-down direction portion connected to the processing cup, the up-down direction portion extending along the up-down direction, and a lateral direction portion connected to a lower end of the up-down direction portion, the lateral direction portion extending along the lateral direction, a connection piping connected to the up-down direction portion, the connection piping arranged to lead the chemical liquid led into the container into the up-down direction portion, a chemical liquid recovery piping arranged to recover chemical liquid led into the recovery piping, a drain piping arranged to drain the liquid led into the recovery piping, and a switching unit arranged to lead the liquid led into the recovery piping selectively into the chemical liquid recovery piping and the drain piping.

With this arrangement, the chemical liquid from the connection piping is supplied to the up-down direction portion. Therefore, the chemical liquid can be dispersed over the entire region in the interior of a portion of the up-down direction portion on the further downstream side than a connection position of the connection piping and the lateral direction portion.

In comparison to the case where the chemical liquid from the chemical liquid supplying unit is supplied to the recovery piping via the substrate, etc., (the substrate or the dummy substrate) and the processing cup, the chemical liquid can be more efficiently supplied to the up-down direction portion. Thus, the chemical liquid can be supplied to the recovery piping while reducing the use amount of the chemical liquid.

Thereby, the substrate processing apparatus with which the chemical liquid can be dispersed over a wide range in the recovery piping while reducing the consumption amount of the chemical liquid can be provided.

The up-down direction portion may have an upper end portion. In this case, the connection piping may be connected to the upper end portion of the up-down direction portion.

With this arrangement, the connection piping is connected to the upper end portion of the up-down direction portion. Thus, the chemical liquid from the connection piping is supplied to the upper end portion of the up-down direction portion, and the chemical liquid can be dispersed over the entire region in the recovery piping.

The aforementioned as well as yet other objects, features, and effects of the present invention will be made clear by the following description of the preferred embodiments, with reference to the accompanying drawings.

DETAILED DESCRIPTION OF PREFERRED EMBODIMENTS

Figure 1:
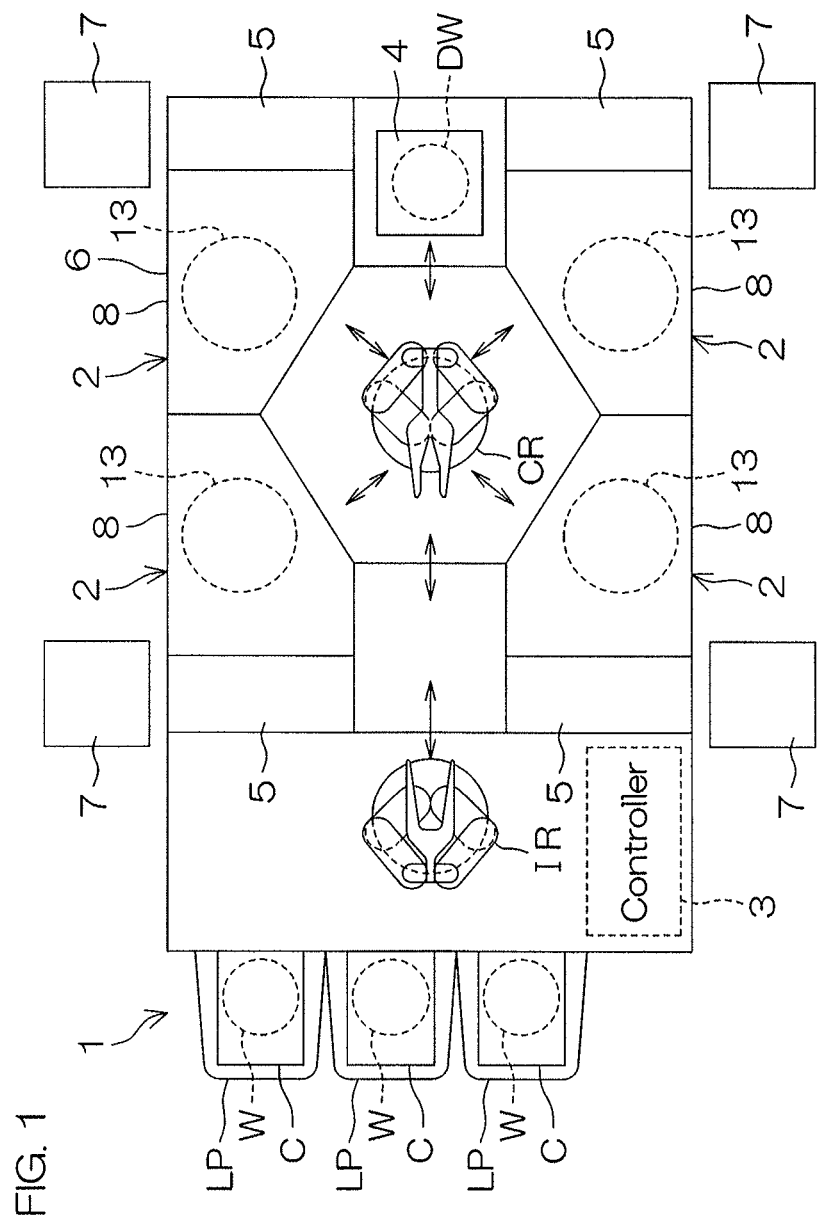
FIG. 1 is a schematic view in which a substrate processing apparatus according to a first preferred embodiment of the present invention is seen from the upper side.

FIG. 1 is a schematic view in which a substrate processing apparatus 1 according to a first preferred embodiment of the present invention is seen from the upper side. The substrate processing apparatus 1 is a single substrate processing type apparatus that processes disk-shaped substrates W such as semiconductor wafers, etc., one at a time.

The substrate processing apparatus 1 includes a plurality of load ports LP respectively holding a plurality of carriers C which house the substrates W, a plurality of (e.g. twelve) processing units 2 arranged to process the substrates W transferred from the plurality of load ports LP with a processing liquid such as a chemical liquid, transfer robots arranged to transfer the substrates W to the plurality of processing units 2 from the plurality of load ports LP, and a controller 3 arranged to control the substrate processing apparatus 1. The transfer robots include an indexer robot IR arranged to transfer the substrates W on a route between the load ports LP and the processing units 2, and a center robot CR arranged to transfer the substrates W on a route between the indexer robot IR and the processing units 2.

On the opposite side of the indexer robot IR with respect to the center robot CR, a dummy substrate holding base 4 on which dummy substrates DW to be used for cup cleaning processing to be described later are held is disposed. The plurality of (e.g. four) dummy substrates DW can be laminated on and held by the dummy substrate holding base 4. The center robot CR can take out the dummy substrate DW from the dummy substrate holding base 4 and house the already-used dummy substrate DW onto the dummy substrate holding base 4. Further, by making a hand of the center robot CR access the individual processing unit 2, the dummy substrate DW can be carried in or out from the processing unit 2.

The substrate processing apparatus 1 includes a plurality of (four) fluid boxes 5 housing chemical liquid valves 21 (see FIG. 4, etc.), etc. The processing units 2 and the fluid boxes 5 are disposed inside an outer wall 6 of the substrate processing apparatus land covered by the outer wall 6 of the substrate processing apparatus 1. A plurality of (four) storage boxes 7 housing chemical liquid tanks 71 (see FIG. 4), etc., are disposed outside the outer wall 6 of the substrate processing apparatus 1. The storage boxes 7 may be disposed on the sides of the substrate processing apparatus 1 or may be disposed below (underground) a clean room in which the substrate processing apparatus 1 is installed.

The twelve processing units 2 define four towers disposed to surround the center robot CR in a plan view. Each of the towers includes three processing units 2 laminated in the up-down direction. The four storage boxes 7 respectively correspond to the four towers. Similarly, the four fluid boxes 5 respectively correspond to the four towers. The chemical liquid stored in the chemical liquid tank 71 (see FIG. 4) in each of the storage boxes 7 is supplied to the three processing units 2 corresponding to the storage box 7 via the fluid box 5 corresponding to the storage box 7. The chemical liquid supplied to the substrates W by the three processing units 2 defining the same tower is recovered into the chemical liquid tank 71 in the storage box 7 corresponding to the tower via the fluid box 5 corresponding to the tower. The plurality of storage boxes 7 may be disposed inside the outer wall 6 of the substrate processing apparatus 1.

Figure 2:
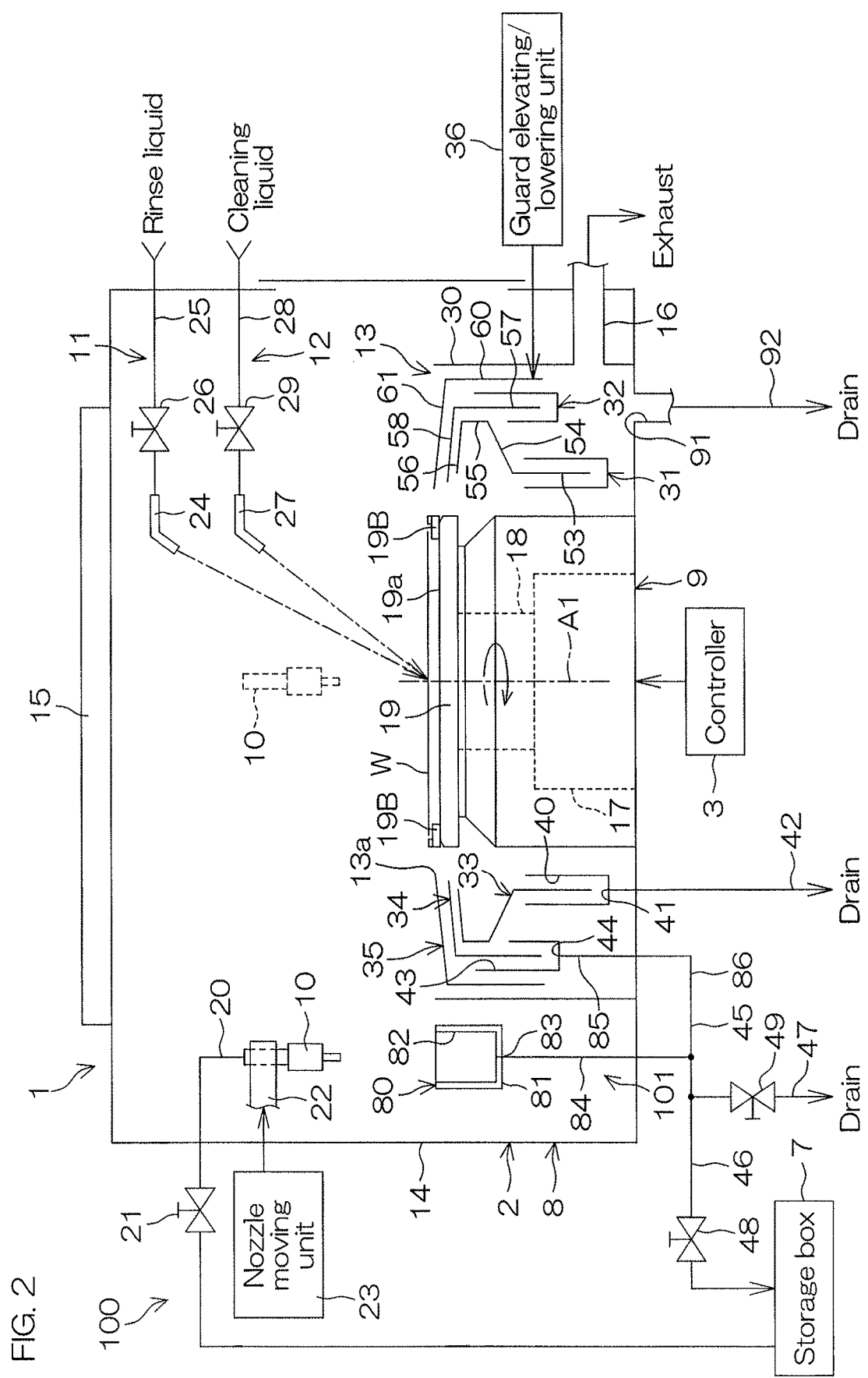
FIG. 2 is an illustrative sectional view for describing an arrangement example of a processing unit.
Figure 3A:
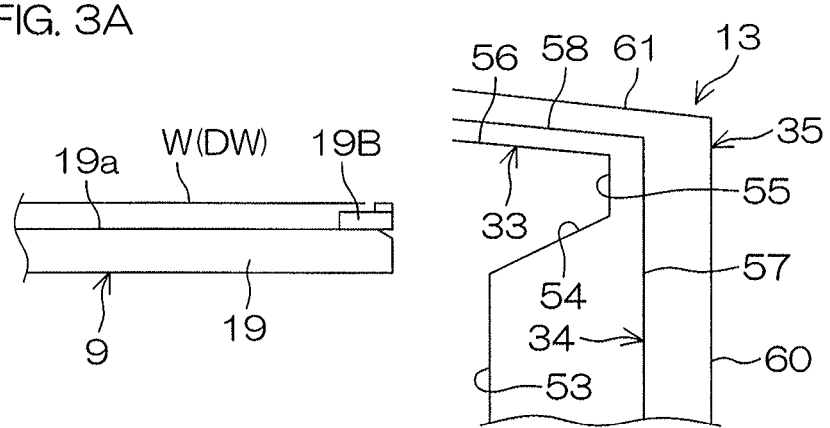
FIGS. 3A to 3C are sectional views for describing changes of height positions of guards.
Figure 3B:
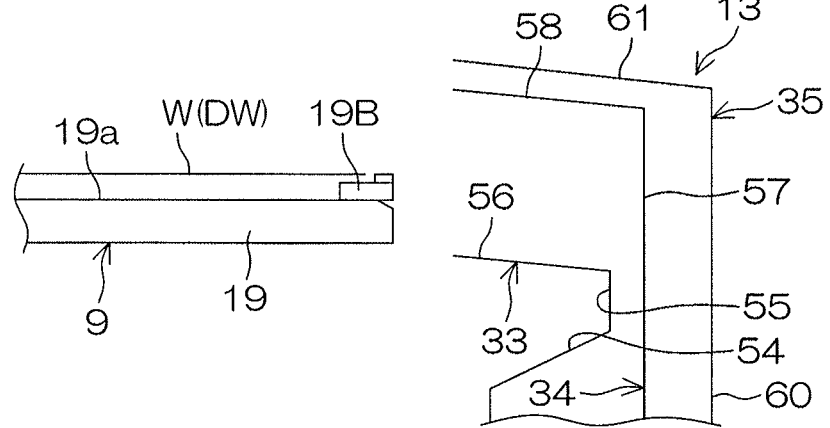
Figure 3C:
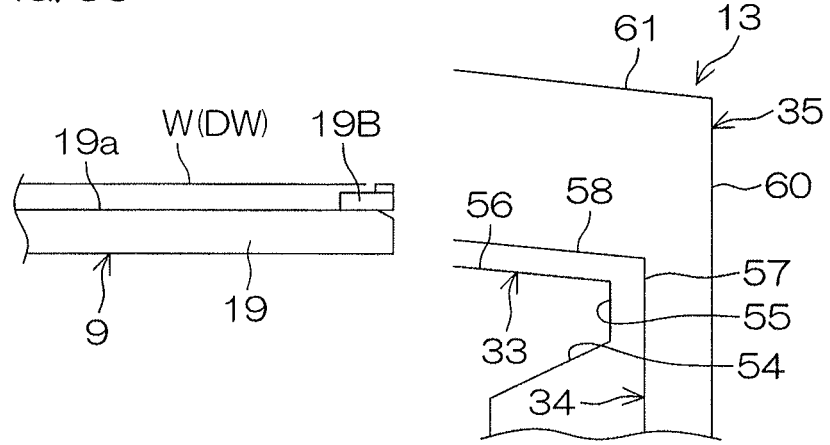

FIG. 2 is an illustrative sectional view for describing an arrangement example of the processing unit 2. FIGS. 3A to 3C are sectional views for describing changes of height positions of guards.

As shown in FIG. 2, the processing unit 2 includes a box-shaped chamber 8 having an internal space, a spin chuck 9 holding a single substrate W in a horizontal orientation inside the chamber 8 and rotating the substrate W around a vertical rotational axis A1 passing through a center of the substrate W, a chemical liquid nozzle 10 arranged to supply the chemical liquid to an upper surface (front surface) of the substrate W held by the spin chuck 9, a rinse liquid supplying unit 11 arranged to supply a rinse liquid to the upper surface of the substrate W held by the spin chuck 9, a cleaning liquid supplying unit 12 arranged to supply a cleaning liquid to the upper surface of the substrate W held by the spin chuck 9, and a cylindrical processing cup 13 surrounding the spin chuck 9.

As shown in FIG. 2, the chamber 8 includes a box-shaped partition wall 14, an FFU (fan filter unit) 15 as a blower unit that feeds the clean air from an upper portion of the partition wall 14 into the interior of the partition wall 14 (corresponding to the interior of the chamber 8), and an exhaust apparatus (not shown) that exhausts a gas inside the chamber 8 from a lower portion of the partition wall 14.

As shown in FIG. 2, the FFU 15 is disposed above the partition wall 14 and mounted on a ceiling of the partition wall 14. The FFU 15 feeds the clean air into the chamber 8 from the ceiling of the partition wall 14. The exhaust apparatus (not shown) is connected to a bottom portion of the processing cup 13 via an exhaust duct 16 which is connected to the interior of the processing cup 13 and suctions the interior of the processing cup 13 from the bottom portion of the processing cup 13. A down flow (downward flow) is formed inside the chamber 8 by the FFU 15 and the exhaust apparatus (not shown).

As shown in FIG. 2, as the spin chuck 9, a clamping type chuck that clamps the substrate W in the horizontal direction to hold the substrate W horizontally is adopted. Specifically, the spin chuck 9 includes a spin motor 17, a spin shaft 18 integrated with a drive shaft of the spin motor 17, and a disk-shaped spin base 19 mounted on an upper end of the spin shaft 18 substantially horizontally.

The spin base 19 includes a horizontal and circular upper surface 19a having an outer diameter greater than an outer diameter of the substrate W. A plurality of (not less than three; for example, six) clamping members 19B are disposed at a peripheral edge portion of the upper surface 19a. At an upper surface peripheral edge portion of the spin base 19, the plurality of clamping members 19B are disposed at suitable intervals, for example, at equal intervals, on a circumference corresponding to an outer peripheral shape of the substrate W.

The spin chuck 9 is not limited to a clamping type and, for example, a vacuum suction type arrangement (vacuum chuck) that vacuum-suctions a rear surface of the substrate W to hold the substrate W in a horizontal orientation and further performs rotation about the vertical rotational axis in this state to rotate the substrate W held by the spin chuck 9 may be adopted instead.

As shown in FIG. 2, a chemical liquid piping 20 arranged to supply the chemical liquid circulated through a circulation piping 75 (see FIG. 4) (or stored in the storage box 7) to the chemical liquid nozzle 10 is connected to the chemical liquid nozzle 10. The chemical liquid valve 21 arranged to open and close the chemical liquid piping 20 is interposed in the chemical liquid piping 20.

The processing unit 2 further includes a nozzle arm 22 in which the chemical liquid nozzle 10 is attached to a tip portion, and a nozzle moving unit 23 arranged to move the nozzle arm 22 to move the chemical liquid nozzle 10. The chemical liquid nozzle 10 is attached to the nozzle arm 22 extending in the horizontal direction in a state where a discharge port of the chemical liquid nozzle 10 faces the lower side or the obliquely lower side.

As shown in FIG. 2, the rinse liquid supplying unit 11 includes a rinse liquid nozzle 24. The rinse liquid nozzle 24 is, for example, a straight nozzle that discharges a liquid in a state of a continuous stream and is disposed fixedly above the spin chuck 9 with a discharge port thereof facing an upper surface central portion of the substrate W. A rinse liquid piping 25 to which the rinse liquid from a rinse liquid supply source is supplied is connected to the rinse liquid nozzle 24. A rinse liquid valve 26 arranged to open and close the rinse liquid piping 25 is interposed in a middle portion of the rinse liquid piping 25. When the rinse liquid valve 26 is opened, the rinse liquid of a continuous stream supplied from the rinse liquid piping 25 to the rinse liquid nozzle 24 is discharged from the discharge port set at a lower end of the rinse liquid nozzle 24 and supplied to the upper surface of the substrate W. When the rinse liquid valve 24 is closed, the supply of the cleaning liquid from the rinse liquid piping 25 to the rinse liquid nozzle 24 is stopped, and the discharge of the rinse liquid from the rinse liquid nozzle 24 is stopped. The rinse liquid supplied from the rinse liquid piping 25 to the rinse liquid nozzle 24 is, for example, water. Although water is, for example, deionized water (DIW), water is not limited to DIW but may be any of carbonated water, electrolyzed ion water, hydrogen water, ozone water, and aqueous hydrochloric acid solution of dilute concentration (for example, of approximately 10 to 100 ppm).

The rinse liquid supplying unit 11 may include a rinse liquid nozzle moving apparatus that moves the rinse liquid nozzle 24 to scan a liquid landing position of the rinse liquid with respect to the upper surface of the substrate W within the plane of the substrate W.

As shown in FIG. 2, the cleaning liquid supplying unit 12 includes a cleaning liquid nozzle 27. The cleaning liquid nozzle 27 is, for example, a straight nozzle that discharges a liquid in a state of a continuous stream and is disposed fixedly above the spin chuck 9 with a discharge port thereof facing the upper surface central portion of the substrate W. A cleaning liquid piping 28 to which the cleaning liquid from a cleaning liquid supply source is supplied is connected to the cleaning liquid nozzle 27. A cleaning liquid valve 29 arranged to open and close the cleaning liquid piping 28 is interposed in a middle portion of the cleaning liquid piping 28. When the cleaning liquid valve 29 is opened, the cleaning liquid of a continuous stream supplied from the cleaning liquid piping 28 to the cleaning liquid nozzle 27 is discharged from the discharge port set at a lower end portion of the cleaning liquid nozzle 27 and supplied to the upper surface of the substrate W. When the cleaning liquid valve 29 is closed, the supply of the cleaning liquid from the cleaning liquid piping 28 to the cleaning liquid nozzle 27 is stopped, and the discharge of the cleaning liquid from the cleaning liquid nozzle 27 is stopped. The cleaning liquid supplied from the cleaning liquid piping 28 to the cleaning liquid nozzle 27 is, for example, water. Although water is, for example, deionized water (DIW), water is not limited to DIW but may be any of carbonated water, electrolyzed ion water, hydrogen water, ozone water, and aqueous hydrochloric acid solution of dilute concentration (for example, of approximately 10 to 100 ppm).

The cleaning liquid supplying unit 12 may include a cleaning liquid nozzle moving apparatus that moves the cleaning liquid nozzle 27 to scan a liquid landing position of the cleaning liquid with respect to the upper surface of the substrate W within the plane of the substrate W.

In a case where water such as deionized water (DIW) is used as the cleaning liquid, the cleaning liquid can be supplied to the upper surface of the substrate W by using the rinse liquid supplying unit 11. In this case, the supply of the rinse liquid to the substrate W and the supply of the cleaning liquid to the substrate W can be performed by the same supplying unit (rinse liquid supplying unit 11). Thus, the cleaning liquid supplying unit 12 can be eliminated.

As shown in FIG. 2 and FIGS. 3A to 3C, the processing cup 13 includes a circular cylindrical member 30, a plurality of cups 31 and 32 (first and second cups 31 and 32) disposed fixedly so as to doubly surround the spin chuck 9 on the inner side of the circular cylindrical member 30, a plurality of guards 33 to 35 (first, second, and third guards 33, 34, and 35) arranged to catch the processing liquid (the chemical liquid or the rinse liquid) scattered to a periphery of the substrate W, and a guard elevating/lowering unit 36 arranged to elevate and lower each of the guards 33 to 35 independently. The guard elevating/lowering unit 36 has an arrangement that includes, for example, a ball screw mechanism.

The processing cup 13 is collapsible, and deployment and collapsing of the processing cup 13 are performed by the guard elevating/lowering unit 36 elevating and lowering at least one of the three guards 33 to 35.

As shown in FIG. 2, the first cup 31 has a circular annular shape and, at a position between the spin chuck 9 and the circular cylindrical member 30, surrounds a periphery of the spin chuck 9. The first cup 31 has a shape that is substantially rotationally symmetric with respect to the rotational axis A1 of the substrate W. The first cup 31 has a U-shaped cross section and defines a first groove 40 arranged to collect and drain the processing liquid already used for processing of the substrate W. A drain port 41 is opened at the lowest location of a bottom portion of the first groove 40 and a first drain piping 42 is connected to the drain port 41. A downstream end of the first drain piping 42 is connected to a draining apparatus (not shown; may be a discarding apparatus), and the processing liquid led into the first drain piping 42 is fed to the draining apparatus and subject to drain processing (waste liquid processing) by the draining apparatus.

As shown in FIG. 2, the second cup 32 has a circular annular shape and surrounds a periphery of the first cup 31. The second cup 32 has a shape that is substantially rotationally symmetric with respect to the rotational axis A1 of the substrate W. The second cup 32 has a U-shaped cross section and defines a second groove 43 arranged to collect and recover the processing liquid already used for processing of the substrate W. A recovery port 44 is opened at the lowest location of a bottom portion of the second groove 43 and a recovery piping 45 is connected to the recovery port 44. A chemical liquid recovery piping 46 and a second drain piping 47 are respectively connected to the recovery piping 45. A downstream end of the chemical liquid recovery piping 46 is connected to a recovery tank 72 (see FIG. 4). A recovery valve 48 is interposed in the chemical liquid recovery piping 46.

A downstream end of the second drain piping 47 is connected to the draining apparatus (not shown; may be a discarding apparatus), and the processing liquid led into the second drain piping 47 is fed to the draining apparatus and subject to drain processing (waste liquid processing) by the draining apparatus. A drain valve 49 arranged to open and close the second drain piping 47 is interposed in the second drain piping 47.

By the recovery valve 48 being opened while the drain valve 49 is closed, the liquid flowing through the recovery piping 45 is led into the chemical liquid recovery piping 46. By the drain valve 49 being opened while the recovery valve 48 is closed, the liquid flowing through the recovery piping 45 is led into the second drain piping 47. That is, the recovery valve 48 and the drain valve 49 function as a switching unit arranged to switch a flow destination of the liquid flowing through the recovery piping 45 between the chemical liquid recovery piping 46 and the second drain piping 47.

As shown in FIG. 2, the innermost first guard 33 surrounds the periphery of the spin chuck 9 and has a shape that is substantially rotationally symmetric with respect to the rotational axis A1 of the substrate W by the spin chuck 9. The first guard 33 includes a lower end portion 53 of circular cylindrical shape surrounding the periphery of the spin chuck 9, a cylindrical portion 54 extending outward (in the direction of going away from the rotational axis A1 of the substrate W) from an upper end of the lower end portion 53, an intermediate portion 55 of circular cylindrical shape extending vertically upward from an upper surface outer peripheral portion of the cylindrical portion 54, and an upper end portion 56 of circular annular shape extending obliquely upward and inward (in the direction of approaching the rotational axis A1 of the substrate W) from an upper end of the intermediate portion 55. The lower end portion 53 is positioned above the first groove 40 and housed in the interior of the first groove 40 in a state where the first guard 33 and the first cup 31 are disposed the closest to each other. An inner peripheral end of the upper end portion 56 constitutes a circle with a diameter greater than the substrate W which is held by the spin chuck 9 in a plan view. A cross-sectional shape of the upper end portion 56 may be rectilinear as shown in FIG. 2, etc., or may, for example, extend in a smooth circular arc.

As shown in FIG. 2, the second innermost second guard 34 surrounds the periphery of the spin chuck 9 on the outer side of the first guard 33 and has a shape that is substantially rotationally symmetric with respect to the rotational axis A1 of the substrate W by the spin chuck 9. The second guard 34 includes a circular cylindrical portion 57 coaxial to the first guard 33, and an upper end portion 58 extending obliquely upward and toward the center (in the direction of approaching the rotational axis A1 of the substrate W) from an upper end of the circular cylindrical portion 57. An inner peripheral end of the upper end portion 58 constitutes a circle with a diameter greater than the substrate W which is held by the spin chuck 9 in a plan view. A cross-sectional shape of the upper end portion 58 may be rectilinear as shown in FIG. 2, etc., or may, for example, extend in a smooth circular arc. A tip of the upper end portion 58 defines an upper opening 13a of the processing cup 13.

The circular cylindrical portion 57 is positioned above the second groove 43. The upper end portion 58 is provided so as to overlap with the upper end portion 56 of the first guard 33 in the up-down direction and so as to come close to the upper end portion 56 while maintaining a minute gap with respect to the upper end portion 56 in a state where the first guard 33 and the second guard 34 are disposed the closest to each other.

As shown in FIG. 2, the outermost third guard 35 surrounds the periphery of the spin chuck 9 on the outer side of the second guard 34 and has a shape that is substantially rotationally symmetric with respect to the rotational axis A1 of the substrate W by the spin chuck 9. The third guard 35 has a circular cylindrical portion 60 coaxial to the second guard 34, and an upper end portion 61 extending obliquely upward and toward the center (in the direction of approaching the rotational axis A1 of the substrate W) from an upper end of the circular cylindrical portion 60. An inner peripheral end of the upper end portion 61 constitutes a circle with a diameter greater than the substrate W which is held by the spin chuck 9 in a plan view. A cross-sectional shape of the upper end portion 61 may be rectilinear as shown in FIG. 2, etc., or may, for example, extend in a smooth circular arc.

As shown in FIG. 2 and FIGS. 3A to 3C, the guard elevating/lowering unit 36 elevates and lowers each of the guards 33 to 35 between an upper position at which an upper end portion of the guard is positioned higher than the substrate W, and a lower position at which the upper end portion of the guard is positioned lower than the substrate W. The guard elevating/lowering unit 36 is capable of holding each of the guards 33 to 35 at any position between the upper position and the lower position. The supply of the processing liquid to the substrate W and the drying of the substrate W are performed in a state where any of the guards 33 to 35 faces a peripheral end surface of the substrate W.

As shown in FIG. 3A, in a case where the innermost first guard 33 is brought to face the peripheral end surface of the substrate W, all of the first to third guards 33 to 35 are disposed at the upper positions.

As shown in FIG. 3B, in a case where the second innermost second guard 34 is brought to face the peripheral end surface of the substrate W, the second and third guards 34 and 35 are disposed at the upper positions and the first guard 33 is disposed at the lower position.

As shown in FIG. 3C, in a case where the outermost third guard 35 is brought to face the peripheral end surface of the substrate W, the third guard 35 is disposed at the upper position and the first and second guards 33 and 34 are disposed at the lower positions.

As shown in FIG. 2, a drain port 91 is defined on a bottom wall of the chamber 8. A third drain piping 92 is connected to the drain port 91. A downstream end of the third drain piping 92 is connected to the draining apparatus (not shown; may be a discarding apparatus), and the processing liquid led into the third drain piping 92 is fed to the draining apparatus and subject to drain processing (waste liquid processing) by the draining apparatus.

Figure 4:
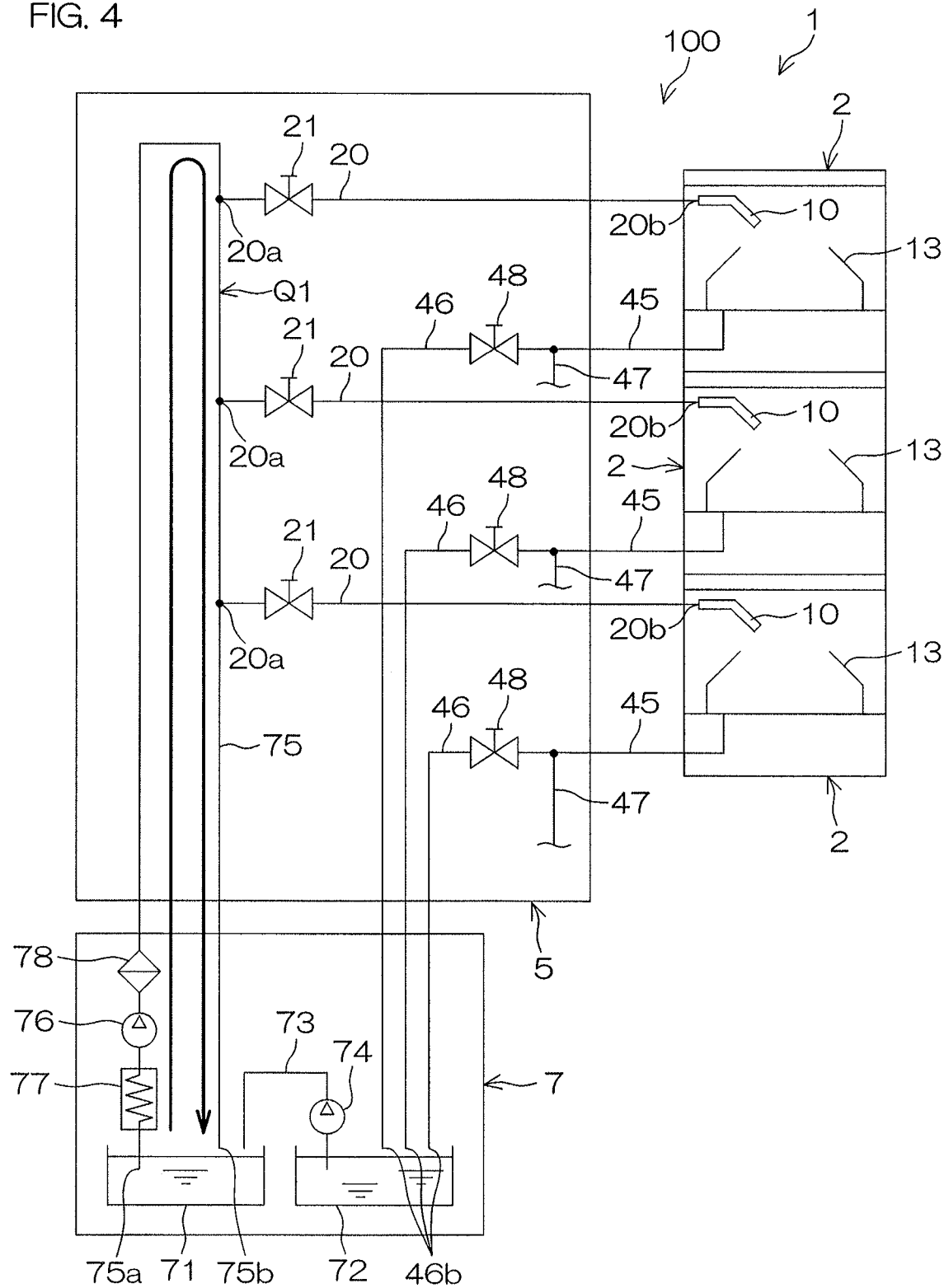
FIG. 4 is a schematic view showing a chemical liquid supplying unit.

FIG. 4 is a schematic view showing a chemical liquid supplying unit 100.

The substrate processing apparatus 1 further includes the chemical liquid tank 71 storing the chemical liquid to be supplied to the chemical liquid nozzles 10, a recovery tank 72 storing the chemical liquid recovered from the processing cup 13, a liquid feeding piping 73 arranged to feed the chemical liquid stored in the recovery tank 72 to the chemical liquid tank 71, a first liquid feeding apparatus 74 arranged to move the chemical liquid in the recovery tank 72 to the liquid feeding piping 73, the circulation piping 75 defining a circulation route Q1 through which the chemical liquid in the chemical liquid tank 71 is circulated, a second liquid feeding apparatus 76 arranged to feed the chemical liquid in the chemical liquid tank 71 to the circulation piping 75, a temperature controller 77 arranged to control a temperature of the chemical liquid to be supplied from the chemical liquid tank 71 to the chemical liquid nozzles 10, and a filter 78 arranged to remove foreign substances in the chemical liquid to be supplied from the chemical liquid tank 71 to the chemical liquid nozzles 10. The chemical liquid tank 71, the recovery tank 72, the first liquid feeding apparatus 74, the second liquid feeding apparatus 76, the temperature controller 77, and the filter 78 are disposed inside the storage box 7. In the present preferred embodiment, the chemical liquid supplying unit 100 is arranged by the chemical liquid nozzles 10, the chemical liquid pipings 20, the chemical liquid tank 71, the recovery tank 72, the liquid feeding piping 73, the first liquid feeding apparatus 74, the circulation piping 75, the second liquid feeding apparatus 76, the temperature controller 77, and the filter 78.

An upstream end 75a and a downstream end 75b of the circulation piping 75 are connected inside the chemical tank 71. The circulation piping 75 includes a supply portion arranged to lead the chemical liquid in the chemical liquid tank 71 into the three chemical liquid pipings 20, a connection portion to which the three chemical liquid pipings 20 are connected, and a return portion arranged to lead the chemical liquid passing through the connection portion into the chemical liquid tank 71. The temperature controller 77 is interposed in the supply portion of the circulation piping 75. The temperature controller 77 may be disposed inside the chemical liquid tank 71. The temperature controller 77 controls the temperature of (heats or cools) the chemical liquid within a range from a temperature higher than the room temperature (for example, about 23° C.) to a temperature lower than the room temperature. The chemical liquid fed from the chemical liquid tank 71 to the circulation piping 75 by the first liquid feeding apparatus 74 is heated or cooled by the temperature controller 77 and then returned to the chemical liquid tank 71. The first liquid feeding apparatus 74 is a pump that suctions the chemical liquid in the recovery tank 72 and discharges the suctioned chemical liquid. The first liquid feeding apparatus 74 may be a pressurizing apparatus that boosts the atmospheric pressure in the recovery tank 72 to feed the chemical liquid in the recovery tank 72 to the liquid feeding piping 73. The second liquid feeding apparatus 76 is a pump that suctions the chemical liquid in the chemical liquid tank 71 and discharges the suctioned chemical liquid. The second liquid feeding apparatus 76 may be a pressurizing apparatus that boosts the atmospheric pressure in the chemical liquid tank 71 to feed the chemical liquid in the chemical liquid tank 71 to the circulation piping 75.

An example of the chemical liquid circulated through the circulation piping 75 includes BHF (buffered hydrogen fluoride). As described above, the chemical liquid circulated through the circulation piping 75 is supplied to the three processing units 2. An upstream end 20a of the chemical liquid piping 20 provided in the individual processing unit 2 is connected to the circulation piping 75. A downstream end 20b of the chemical liquid piping 20 is connected to the chemical liquid nozzle 10. The chemical liquid valve 21 is disposed inside the fluid box 5. The same is applied to the other two chemical liquid pipings 20. When the chemical liquid valve 21 is opened, the chemical liquid flowing in the circulation piping 75 passes through the chemical liquid piping 20 and is supplied to the chemical liquid nozzle 10, and the chemical liquid is discharged from the discharge port of the chemical liquid nozzle 10.

The three chemical liquid recovery pipings 46 respectively correspond to the three processing units 2 defining the same tower. A downstream end 46b of the chemical liquid recovery piping 46 is connected to the recovery tank 72. The recovery valve 48 and the drain valve 49 are disposed inside the fluid box 5. The same is applied to the other two chemical liquid recovery pipings 46. When the recovery valve 48 is opened, the chemical liquid flowing through the recovery piping 45 passes through the chemical liquid recovery piping 46 and is supplied to the recovery tank 72.

As shown in FIG. 2, the processing unit 2 includes a standby pot (container) 80 disposed in the periphery of the spin chuck 9 in a plan view. The standby pot 80 is a pot arranged to catch the chemical liquid discharged from the chemical liquid nozzle 10 which is disposed at a home position where chemical liquid nozzle retracts from above the substrate W. The standby pot 80 includes a box-shaped housing 81. The housing 81 has an opening 82 defined on an upper surface of the housing 81, and an ejection port 83 defined on a bottom wall of the housing 81. An upstream end portion of a connection piping 84 as a cleaning chemical liquid supply piping arranged to supply a cleaning chemical liquid of the same type as the chemical liquid to the recovery piping 45 is connected to the ejection port 83 of the standby pot 80. A downstream end portion of the connection piping 84 is connected to the recovery piping 45. The chemical liquid discharged from the chemical liquid nozzle 10 set at the home position flows into the housing 81 via the opening 82 and is caught by the standby pot 80. The chemical liquid caught by the standby pot 80 is supplied into the recovery piping 45 via the connection piping 84.

In the present preferred embodiment, the chemical liquid supplied from the chemical liquid nozzle 10 to the recovery piping 45 via the standby pot 80 and the connection piping 84 is used as the cleaning chemical liquid to replace the cleaning liquid in the recovery piping 45. That is, the cleaning chemical liquid is a liquid of the same type as the chemical liquid. Further, from the chemical liquid nozzle 10, the standby pot 80 and the connection piping 84 are included in a cleaning chemical liquid supplying unit 101. The cleaning chemical liquid supplying unit 101 includes the chemical liquid supplying unit 100, the standby pot 80, and the connection piping 84.

Figure 5:
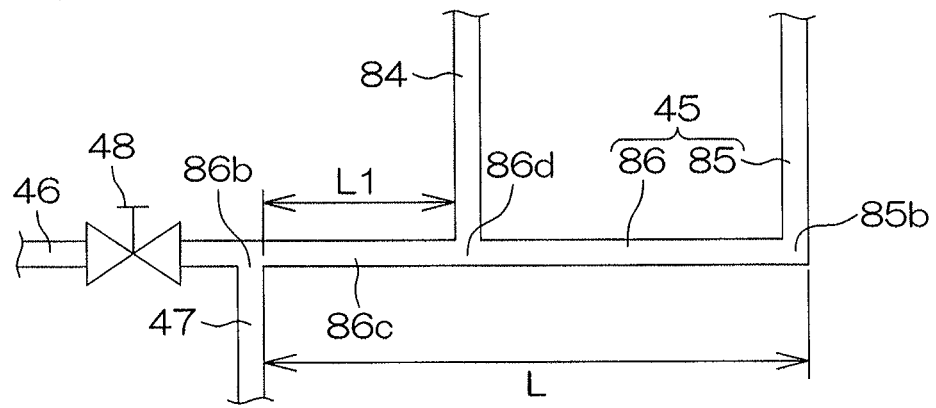
FIG. 5 is a view for describing an arrangement of a recovery piping provided in the substrate processing apparatus.

FIG. 5 is a view for describing an arrangement of the recovery piping 45.

The recovery piping 45 is, for example, an L-shaped piping, and has an up-down direction portion 85 which is a circular pipe extending along the up-down direction (substantially vertical direction), and a lateral direction portion 86 which is a circular pipe extending from a downstream end (lower end) 85b of the up-down direction portion 85 along the lateral direction (substantially horizontal direction). The lateral direction portion 86 may slightly slope (for example, by an angle of 0° to 5°) so as to go down toward a tip. An upstream end of the up-down direction portion 85 is connected to the recovery port 44 (see FIG. 2). An upstream end of the chemical liquid recovery piping 46 and an upstream end of the second drain piping 47 are respectively connected to a downstream end 86b of the lateral direction portion 86. In the present preferred embodiment, regarding size of the up-down direction portion 85, an inner diameter is about 1.6 cm, and length is about 20 cm. Regarding size of the lateral direction portion 86, an inner diameter is about 1.6 cm, and length L is about 40 cm.

As described above, the downstream end of the connection piping 84 is connected at a predetermined position close to the downstream side in the lateral direction portion 86. Length L1 of a portion 86c on the further downstream side than a connection position 86d in the lateral direction portion (hereinafter, simply referred to as the "downstream portion") is about 7.5 cm, and the volume of the interior of the portion is about 15 cc.

The liquid existing in the up-down direction portion 85 (liquid attached to an inner wall of the up-down direction portion 85) is moved downward (that is, toward the lateral direction portion 86) due to the weight of the liquid.

Figure 6:
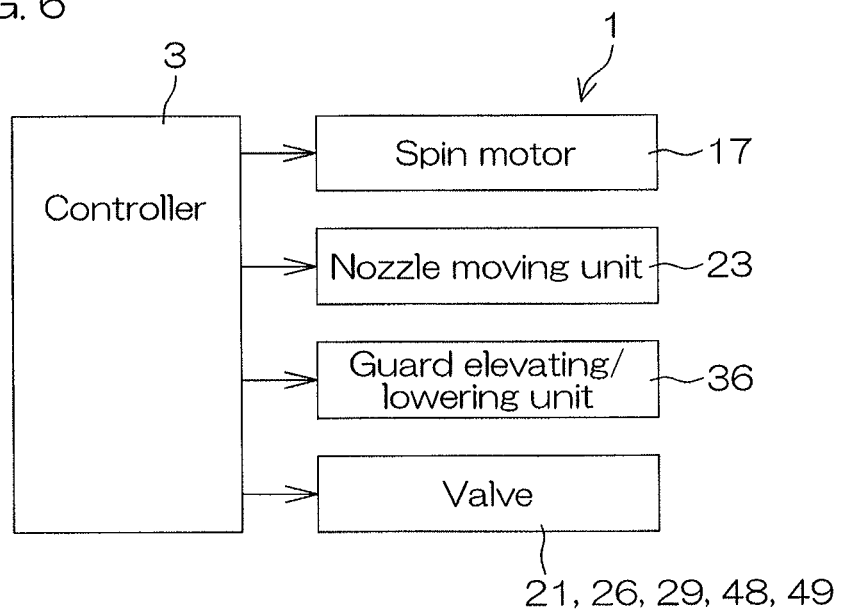
FIG. 6 is a block diagram for describing an electrical arrangement of a main portion of the substrate processing apparatus.

FIG. 6 is a block diagram for describing an electrical arrangement of a main portion of the substrate processing apparatus 1.

The controller 3 is arranged using, for example, a microcomputer. The controller 3 has a computing unit such as a CPU, a storage unit such as a fixed memory device and a hard disk drive, and an input/output unit (not shown). A program to be executed by the computing unit is stored in the storage unit.

In addition, the spin motor 17, the nozzle moving unit 23, the guard elevating/lowering unit 36, the chemical liquid valve 21, the rinse liquid valve 26, the cleaning liquid valve 29, the recovery valve 48, the drain valve 49, etc., are connected to the controller 3 as control objects. The controller 3 controls actions of the spin motor 17, the nozzle moving unit 23, and the guard elevating/lowering unit 36, etc. The controller 3 opens and closes the chemical liquid valve 21, the rinse liquid valve 26, the cleaning liquid valve 29, the recovery valve 48, the drain valve 49, etc.

Figure 7:
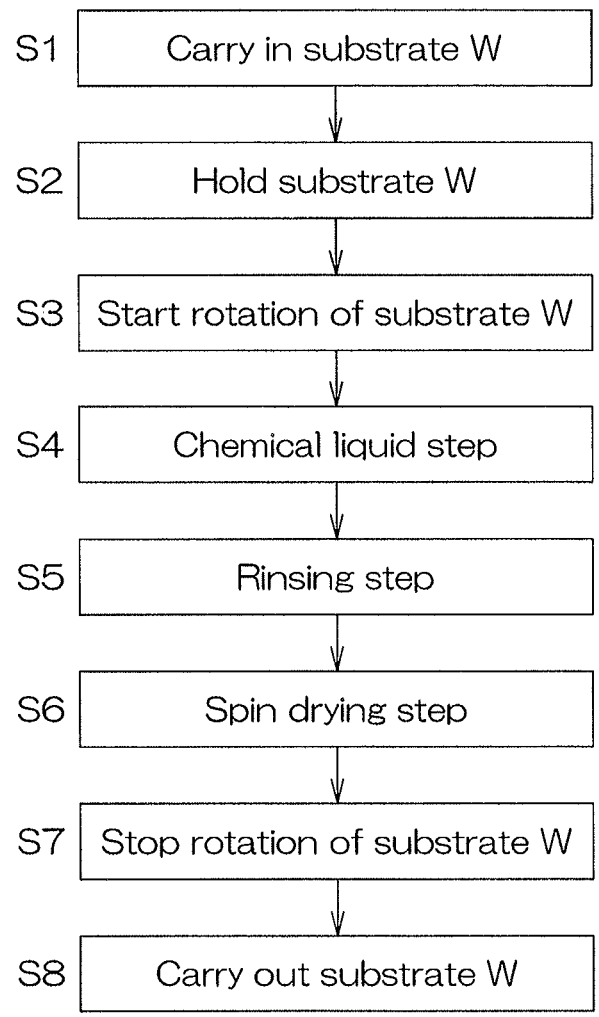
FIG. 7 is a flowchart for describing an example of substrate processing performed by the processing unit.

FIG. 7 is a flowchart for describing an example of substrate processing performed by the processing unit 2. The example of the substrate processing shall now be described with reference to FIG. 1 to FIG. 7. The example of the substrate processing is an example of chemical liquid processing in which the chemical liquid is supplied to the front surface of the substrate W to process the substrate W. The chemical liquid processing includes etching processing and cleaning processing.

An unprocessed circular substrate W is carried into the chamber 8 of the processing unit 2 from the carrier C by the indexer robot IR and the center robot CR (step S1), the substrate W is delivered to the spin chuck 9 in a state where the front surface (surface to be processed) of the substrate W faces the upper side, and the substrate W is held by the spin chuck 9 (step S2). Before the substrate W is carried in, the chemical liquid nozzle 10 retracts to the home position set on the side of the spin chuck 9. The drain valve 49 is closed and the recovery valve 48 is opened. Therefore, the liquid led into the recovery piping 45 is led into the chemical liquid recovery piping 46.

When the substrate W is held by the spin chuck 9, the controller 3 controls the spin motor 17 to start rotation of the spin base 19, and thereby, rotation of the substrate W is started (step S3). Rotational speed of the substrate W is increased up to a predetermined liquid processing speed and maintained to be the liquid processing speed.

The controller 3 controls the nozzle moving unit 23 to move the chemical liquid nozzle 10 from the home position to above the substrate W.

The controller 3 also controls the guard elevating/lowering unit 36 to elevate the second and third guards 34 and 35 respectively to the upper positions and make the second guard 34 face the peripheral end surface of the substrate W as shown in FIG. 3B.

Next, the controller 3 performs a chemical liquid step of supplying the chemical liquid to the upper surface of the substrate W (step S4). After that, the controller 3 opens the chemical liquid valve 21 and makes the chemical liquid be discharged from the chemical liquid nozzle 10 to the upper surface central portion of the substrate W. The chemical liquid supplied to the upper surface of the substrate W receives a centrifugal force due to the rotation of the substrate W and moves to a peripheral edge portion of the substrate W, and is scattered toward the sides of the substrate W from the peripheral edge portion of the substrate W.

The chemical liquid scattered from the peripheral edge portion of the substrate W is caught by an inner wall of the second guard 34 and is led into the recovery piping 45 after flowing down along the inner wall of the second guard 34 and passing through the second groove 43. The chemical liquid led into the recovery piping 45 passes through the chemical liquid recovery piping 46 and is fed to the recovery tank 72.

When a predetermined period of time elapses from the start of discharge of the chemical liquid, the chemical liquid step S4 is ended. Specifically, the controller 3 closes the chemical liquid valve 21 to stop the discharge of the chemical liquid from the chemical liquid nozzle 10.

The controller 3 also controls the nozzle moving unit 23 to make the chemical liquid nozzle 10 retract to the home position.

The controller 3 also controls the guard elevating/lowering unit 36 to elevate the first guard 33 to the upper position while keeping the second and third guards 34 and 35 respectively at the upper positions and make the first guard 33 face the peripheral end surface of the substrate W as shown in FIG. 3A.

Next, a rinsing step of supplying the rinse liquid to the upper surface of the substrate W (step S5) is performed. Specifically, the controller 3 opens the rinse liquid valve 26. The rinse liquid discharged from the rinse liquid nozzle 24 lands on the upper surface central portion of the substrate W and flows on the upper surface of the substrate W toward the peripheral edge portion of the substrate W upon receiving the centrifugal force due to the rotation of the substrate W. The chemical liquid on the substrate W is replaced with the rinse liquid. The rinse liquid flowing on the upper surface of the substrate W is scattered toward the sides of the substrate W from the peripheral edge portion of the substrate W and caught by an inner wall of the first guard 33. The rinse liquid flowing down along the inner wall of the first guard 33 is collected at the first groove 40 and then led into the first drain piping 42, and after that, led into a drain processing apparatus (not shown) that performs drain processing of the processing liquid.

When a predetermined period of time elapses from the start of discharge of water, the controller 3 closes the rinse liquid valve 26 to stop the discharge of the rinse liquid from the rinse liquid nozzle 24. Thereby, the rinsing step S5 is ended. The controller 3 also controls the guard elevating/lowering unit 36 to lower the first and second guards 33 and 34 to the lower positions while keeping the third guard 35 at the upper position and make the third guard 35 face the peripheral end surface of the substrate W as shown in FIG. 3C.

Next, a spin drying step of drying the substrate W (step S6) is performed. Specifically, the controller 3 controls the spin motor 17 to accelerate the substrate W to drying rotational speed (of, for example, several thousand rpm) which is greater than the rotational speed in the chemical liquid step S4 and the rinsing step S5 and rotate the substrate W at the drying rotational speed. Thereby, a large centrifugal force is applied to the liquid on the substrate W and the liquid attached to the substrate W is spun off to a periphery of the substrate W. In such a way, the liquid is removed from the substrate W and the substrate W is dried.

When a predetermined period of time elapses from the start of high-speed rotation of the substrate W, the controller 3 controls the spin motor 17 to stop the rotation of the substrate W by the spin chuck 9 (step S7). After that, the controller 3 controls the guard elevating/lowering unit 36 to lower the third guard 35 to the lower position while keeping the first and second guards 33 and 34 at the lower positions. Thereby, the upper ends of the first to third guards 33 to 35 are all disposed lower than the substrate W holding position (the state shown in FIG. 2).

Next, the substrate W is carried out from the interior of the chamber 8 (step S8). Specifically, the controller 3 makes the hand of the center robot CR enter the chamber 8. The controller 3 then makes the hand of the center robot CR hold the substrate W on the spin chuck 9. After that, the controller 3 makes the hand of the center robot CR retract from the interior of the chamber 8. Thereby, the substrate W already subjected to the chemical liquid processing is carried out from the chamber 8.

After the substrate W is carried out, the cup cleaning processing may be performed in some cases. For example, the following cup cleaning processing is executed every time processing for one lot of the substrates W (all the substrates W housed in one carrier) is ended.

Figure 8:
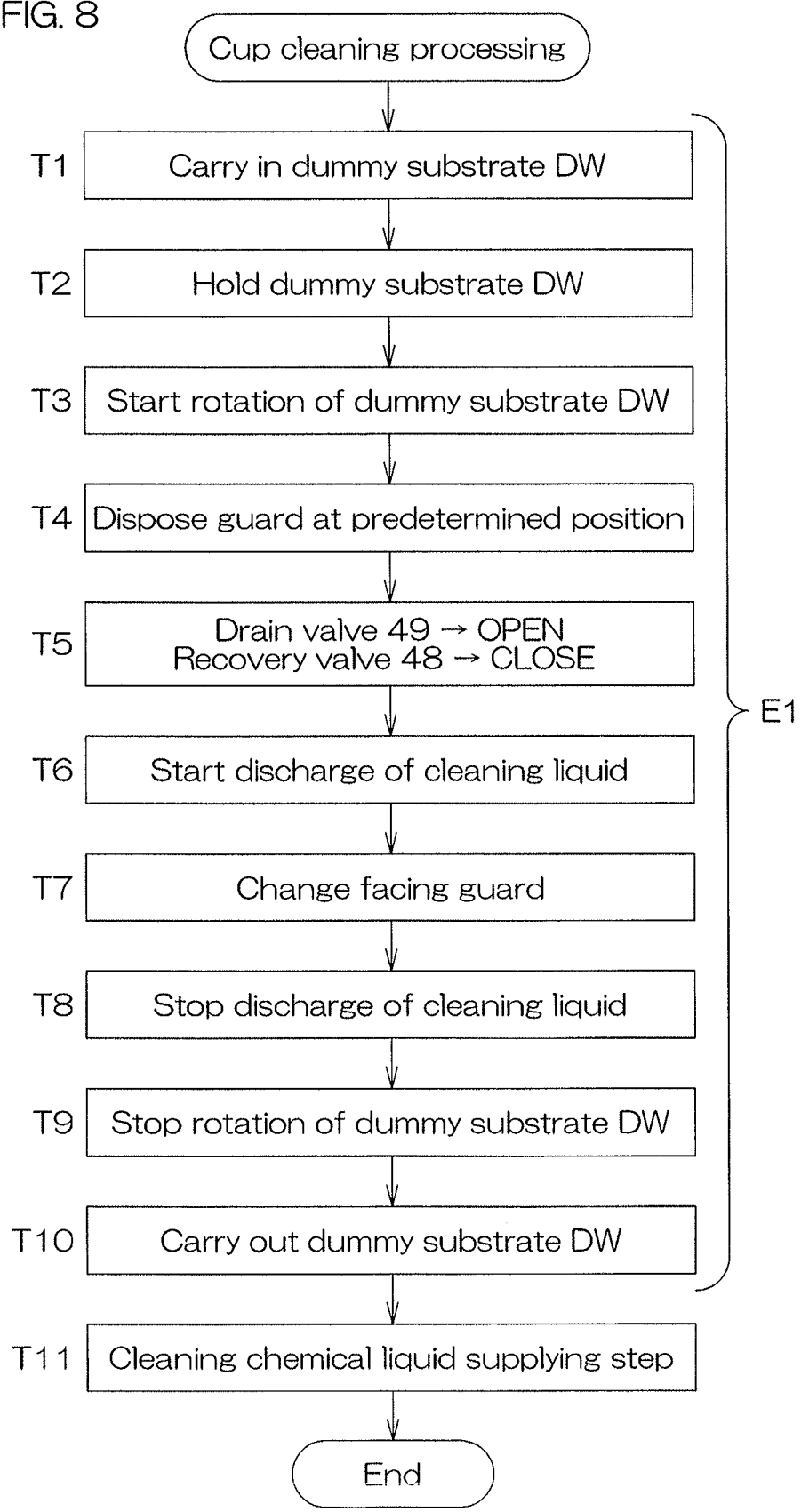
FIG. 8 is a flowchart for describing a processing example of cup cleaning processing performed by the processing unit.

FIG. 8 is a flowchart for describing a processing example of the cup cleaning processing performed by the processing unit 2. The processing example of the cup cleaning processing shall now be described with reference to FIG. 1 to FIG. 6 and FIG. 8. In the present preferred embodiment, the cup cleaning processing includes a cup cleaning step (piping cleaning step) E1 and a cleaning chemical liquid supplying step T11.

The substrate processing apparatus 1 is normally in a state where the drain valve 49 is closed and the recovery valve 48 is opened, and also in such a state when the cup cleaning processing is started. Therefore, the liquid passing through the recovery piping 45 is led into the chemical liquid recovery piping 46.

The cup cleaning processing is performed by making the spin chuck 9 hold, for example, a SiC dummy substrate DW, and supplying the cleaning liquid and the cleaning chemical liquid (cleaning chemical liquid of the same type as the chemical liquid) to the dummy substrate DW in a rotated state. The dummy substrate DW has the same shape and the same size as the substrate W to be subjected to the chemical liquid processing performed by the processing unit 2. Therefore, the cleaning liquid scattered from a peripheral edge of the dummy substrate DW is caught at the same position as the processing liquid (the chemical liquid or the rinse liquid) scattered from the peripheral edge of the substrate W at the time of the chemical liquid processing.

The center robot CR takes out the dummy substrate DW from the dummy substrate holding base 4 and carries the dummy substrate DW into the chamber 8 of the processing unit 2 (step T1), and makes the spin chuck 9 hold the dummy substrate DW (step T2). Before the dummy substrate DW is carried in, the chemical liquid nozzle 10 retracts to the home position set on the side of the spin chuck 9.

When the dummy substrate DW is held by the spin chuck 9, the controller 3 controls the spin motor 17 to start the rotation of the spin base 19, and thereby, rotation of the dummy substrate DW is started (step T3).

The controller 3 also controls the guard elevating/lowering unit 36 to make a predetermined guard among the first to third guards 33 to 35 face a peripheral end surface of the dummy substrate DW (step T4). In a case where the guard facing the peripheral end surface of the dummy substrate DW is the first guard 33 as shown in FIG. 3A, the first to third guards 33 to 35 are respectively elevated to the upper positions.

Also, the controller 3 closes the recovery valve 48 and opens the drain valve 49 (step T5). Thus, the liquid passing through the recovery piping 45 after this is led into the first drain piping 42.

When rotational speed of the dummy substrate DW reaches a predetermined speed, the controller 3 opens the cleaning liquid valve 29. Therefore, the cleaning liquid is discharged from the cleaning liquid nozzle 27, and thereby, the cleaning liquid is supplied to an upper surface of the dummy substrate DW (step T6). The cleaning liquid discharged from the cleaning liquid nozzle 27 lands on an upper surface central portion of the dummy substrate DW and flows on the upper surface of the dummy substrate DW toward the peripheral edge portion of the dummy substrate DW upon receiving a centrifugal force due to the rotation of the dummy substrate DW, and is scattered toward the sides of the dummy substrate DW from the peripheral edge portion of the dummy substrate DW.

In this case, the cleaning liquid scattered from the peripheral edge portion of the dummy substrate DW is caught by an inner side surface of the first guard 33. The cleaning liquid flows down along the inner wall of the first guard 33 and is collected at the first groove 40 and then led into the first drain piping 42, and after that, led into the drain processing apparatus (not shown). That is, the inner wall of the first guard 33 and the first groove 40 are cleaned by using the cleaning liquid.

When a predetermined period of time elapses from the start of discharge of the cleaning liquid, the controller 3 controls the guard elevating/lowering unit 36 to change the guard facing the peripheral end surface of the dummy substrate DW (step T7). For example, in a case where the guard facing the peripheral end surface of the dummy substrate DW is changed from the first guard 33 to the second guard 34, the first guard 33 is lowered from the upper position to the lower position. Thereby, as shown in FIG. 3B, the second guard 34 faces the peripheral end surface of the dummy substrate DW.

In this case, the cleaning liquid scattered from the peripheral edge portion of the dummy substrate DW is caught by the inner wall of the second guard 34 or an outer side surface of the first guard 33. These cleaning liquids flow down along the inner wall of the second guard 34 or the outer side surface of the first guard 33 and are collected at the second groove 43 and then led into the recovery piping 45. That is, the inner wall of the second guard 34, the outer side surface of the first guard 33, the second groove 43, and the recovery piping 45 are cleaned by using the cleaning liquid. The cleaning liquid used for cleaning the interior of the processing cup 13 and the recovery piping 45 is led from the recovery piping 45 into the second drain piping 47, and after that, led into the drain processing apparatus (not shown).

When a predetermined period of time elapses from the change of the guard, the controller 3 controls the guard elevating/lowering unit 36 to further change the guard facing the peripheral end surface of the dummy substrate DW (step T7). For example, in a case where the guard facing the peripheral end surface of the dummy substrate DW is changed from the second guard 34 to the third guard 35, the second guard 34 is lowered from the upper position to the lower position. Thereby, as shown in FIG. 3C, the third guard 35 faces the peripheral end surface of the dummy substrate DW.

In this case, the cleaning liquid scattered from the peripheral edge portion of the dummy substrate DW is caught by an inner wall of the third guard 35 or an outer side surface of the second guard 34. These cleaning liquids flow down along the inner wall of the third guard 35 or the outer side surface of the second guard 34 and are supplied to the bottom wall of the chamber 8 and then led into the third drain piping 92, and after that, led into the drain processing apparatus (not shown). That is, the inner wall of the third guard 35 and the outer side surface of the second guard 34 are cleaned by using the cleaning liquid.

When a predetermined period of time elapses from the change of the guard, the controller 3 controls the guard elevating/lowering unit 36 to lower the third guard 35 from the upper position to the lower position. Thereby, all the first to third guards 33 to 35 are brought into a state of being disposed at the lower positions.

In this case, the cleaning liquid scattered from the peripheral edge portion of the dummy substrate DW is supplied to an outer side surface of the third guard 35. Thereby, the outer side surface of the third guard 35 is cleaned by using the cleaning liquid.

In each of a state where the first guard 33 faces the peripheral end surface of the dummy substrate DW, a state where the second guard 34 faces the peripheral end surface of the dummy substrate DW, and a state where the third guard 35 faces the peripheral end surface of the dummy substrate DW, in order to change the direction in which the cleaning liquid is scattered from the peripheral edge of the dummy substrate DW, the rotational speed of the dummy substrate DW is desirably changed.

The order of the step of making the first guard 33 face the peripheral end surface of the dummy substrate DW, the step of making the second guard 34 face the peripheral end surface of the dummy substrate DW, and the step of making the third guard 35 face the peripheral end surface of the dummy substrate DW may be set appropriately.

When a predetermined period of time elapses from the lowering of the guard, the controller 3 closes the cleaning liquid valve 29 to stop the supply of the cleaning liquid to the dummy substrate DW (step T8). The controller 3 also controls the spin motor 17 to stop the rotation of the dummy substrate DW (step T9).

After that, the already-used dummy substrate DW is carried out of the processing unit 2 by the center robot CR (step T10), and housed in the dummy substrate holding base 4. Thereby, the cup cleaning step E1 is ended.

After the cup cleaning step E1 is ended, next, the cleaning chemical liquid supplying step of supplying the cleaning chemical liquid to the recovery piping 45 (step T11) is executed in order to replace the cleaning liquid existing in the recovery piping 45 with the cleaning chemical liquid. In the cleaning chemical liquid supplying step T11, while the liquid led into the recovery piping 45 is led into the drain piping, the cleaning chemical liquid from the connection piping 84 connected to the recovery piping 45 is supplied to the recovery piping 45. When the cleaning chemical liquid supplying step T11 is ended, the cup cleaning processing of FIG. 8 is ended.

Figure 9:
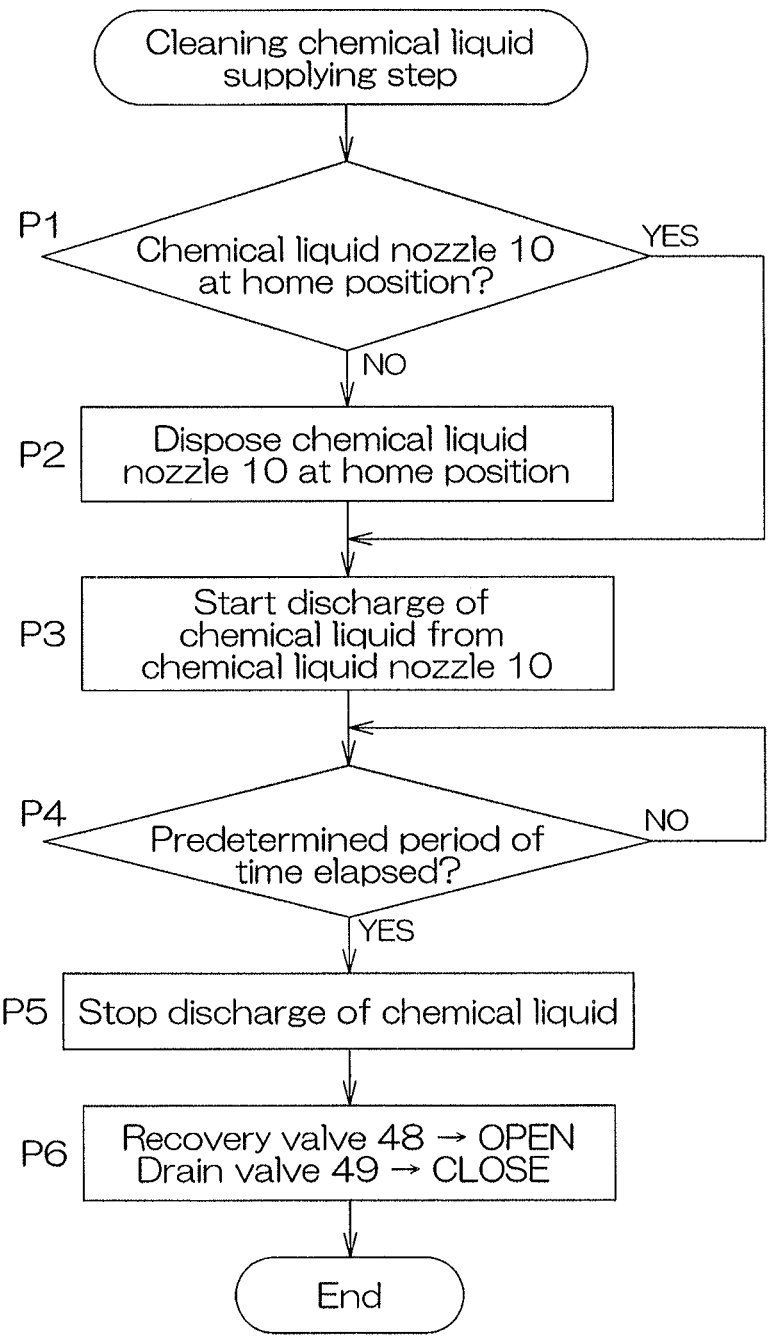
FIG. 9 is a flowchart for describing a cleaning chemical liquid supplying step shown in FIG. 8.

FIG. 9 is a flowchart for describing the cleaning chemical liquid supplying step T11 shown in FIG. 8. The cleaning chemical liquid supplying step T11 will be described with reference to FIG. 1 to FIG. 6, FIG. 8, and FIG. 9.

Upon executing the cleaning chemical liquid supplying step T11, the controller 3 confirms that the chemical liquid nozzle 10 is set at the home position (YES in step P1), and then opens the chemical liquid valve 21 to start the discharge of the chemical liquid from the chemical liquid nozzle 10 (step P3). In a case where the chemical liquid nozzle 10 is not set at the home position (NO in step P1), the controller 3 controls the nozzle moving unit 23 to dispose the chemical liquid nozzle 10 at the home position (step P2), and after that, opens the chemical liquid valve 21 to start the discharge of the chemical liquid from the chemical liquid nozzle 10 (step P3). The chemical liquid discharged from the chemical liquid nozzle 10 set at the home position flows inside the housing 81 via the opening 82 and is caught by the standby pot 80. The chemical liquid caught by the standby pot 80 passes through the connection piping 84 and is supplied into the lateral direction portion 86 of the recovery piping 45 as the cleaning chemical liquid via the up-down direction portion 85. Thereby, the cleaning chemical liquid is dispersed in the downstream portion 86c in the lateral direction portion 86, and the cleaning liquid existing in the downstream portion 86c is replaced with the cleaning chemical liquid.

When a predetermined period of time elapses from the end of the cup cleaning step E1, the cleaning liquid attached to the inner wall of the up-down direction portion 85 is moved toward the lateral direction portion 86 due to the weight of the cleaning liquid. Therefore, when a predetermined period of time elapses from the end of the piping cleaning step, most of the cleaning liquid existing in the recovery piping 45 exists in the lateral direction portion 86 and almost no cleaning liquid exists in the up-down direction portion 85. Moreover, almost all of the cleaning liquid existing in the recovery piping 45 exists in a region in the vicinity of the downstream end 86b of the lateral direction portion 86 (that is, in the downstream portion 86c). In particular, this tendency is remarkable in a case where the lateral direction portion 86 slightly slopes (for example, by an angle of 0° to 5°) so as to go down toward a tip.

As described above, by directly supplying the cleaning chemical liquid to the downstream portion 86c of the lateral direction portion 86, almost all of the cleaning liquid existing in the recovery piping 45 can be replaced with the cleaning chemical liquid. Thereby, the consumption amount of the cleaning chemical liquid can be reduced.

The cleaning chemical liquid supplied to the recovery piping 45 is led into the second drain piping 47. That is, it is possible to satisfactorily supply the cleaning chemical liquid into the second drain piping 47.

By replacing the cleaning liquid existing in the recovery piping 45 with the cleaning chemical liquid, in the chemical liquid processing after the cup cleaning processing, the decrease in the processing rate in accordance with dilution of the chemical liquid can be suppressed.

When a predetermined period of time elapses from the opening of the chemical liquid valve 21 (YES in step P4), the controller 3 closes the chemical liquid valve 21 to stop the discharge of the chemical liquid from the chemical liquid nozzle 10 (step P5). Thereby, the supply of the chemical liquid into the recovery piping 45 as the cleaning chemical liquid is stopped.

The volume of the downstream portion 86c in the lateral direction portion 86 is about 15 cc as described above. Therefore, when the cleaning chemical liquid is supplied to the recovery piping 45 by an amount exceeding this, the cleaning liquid existing in the recovery piping 45 can be replaced with the cleaning chemical liquid. Therefore, the consumption amount of the cleaning chemical liquid can be reduced.

After that, the controller 3 closes the drain valve 49 and opens the recovery valve 48 (step P6). Thereby, the cleaning chemical liquid supplying step T11 is ended.

As described above, according to the present preferred embodiment, the cleaning liquid used for cleaning the interior of the processing cup 13 and the recovery piping 45 in the cup cleaning step E1 is led into the second drain piping 47 from the recovery piping 45 and drained. After the cup cleaning step E1, the cleaning chemical liquid from the connection piping 84 is supplied to the recovery piping 45, and the cleaning liquid existing in the recovery piping 45 is replaced with the cleaning chemical liquid. The cleaning chemical liquid containing the cleaning liquid is led into the second drain piping 47. Thereby, it is possible to prevent or suppress entry of the cleaning liquid used for cleaning the interior of the recovery piping 45 into the chemical liquid recovery piping 46.

The cleaning chemical liquid from the connection piping 84 is directly supplied to the recovery piping 45. Thus, in comparison to a case where the chemical liquid from the chemical liquid nozzle 10 is supplied to the recovery piping 45 as the cleaning chemical liquid via the substrate, etc., (the dummy substrate DW, etc.) and the processing cup 13, efficiency of supplying the cleaning chemical liquid to the recovery piping 45 can be enhanced. As a result, an amount of the cleaning chemical liquid required to replace with the cleaning chemical liquid can be reduced. Thereby, the substrate processing apparatus 1 with which the consumption amount of the cleaning chemical liquid can be reduced while preventing or suppressing entry of the cleaning liquid into the chemical liquid recovery piping 46 can be provided.

The cleaning chemical liquid from the connection piping 84 is supplied to the lateral direction portion 86. Therefore, the cleaning chemical liquid is dispersed in the downstream portion 86c in the lateral direction portion 86. When a predetermined period of time elapses from the end of the cup cleaning step E1, almost no cleaning liquid exists in the up-down direction portion 85. Thus, by directly supplying the cleaning chemical liquid to the lateral direction portion 86, almost all of the cleaning liquid existing in the recovery piping 45 can be replaced with the cleaning chemical liquid. In this case, length of the portion of the piping to be subjected to replacement with the cleaning chemical liquid is short. Thus, in comparison to a case where the cleaning liquid existing in both the up-down direction portion 85 and the lateral direction portion 86 is replaced with the cleaning chemical liquid, the amount of the cleaning chemical liquid (that is, the chemical liquid) used to replace with the cleaning chemical liquid can be furthermore reduced.

The chemical liquid discharged from the chemical liquid nozzle 10 and received by the standby pot 80 passes through the connection piping 84 and is supplied to the recovery piping 45 as the cleaning chemical liquid. Thereby, the arrangement to directly supply the cleaning chemical liquid to the recovery piping 45 can be realized with a simple arrangement.

Figure 10:
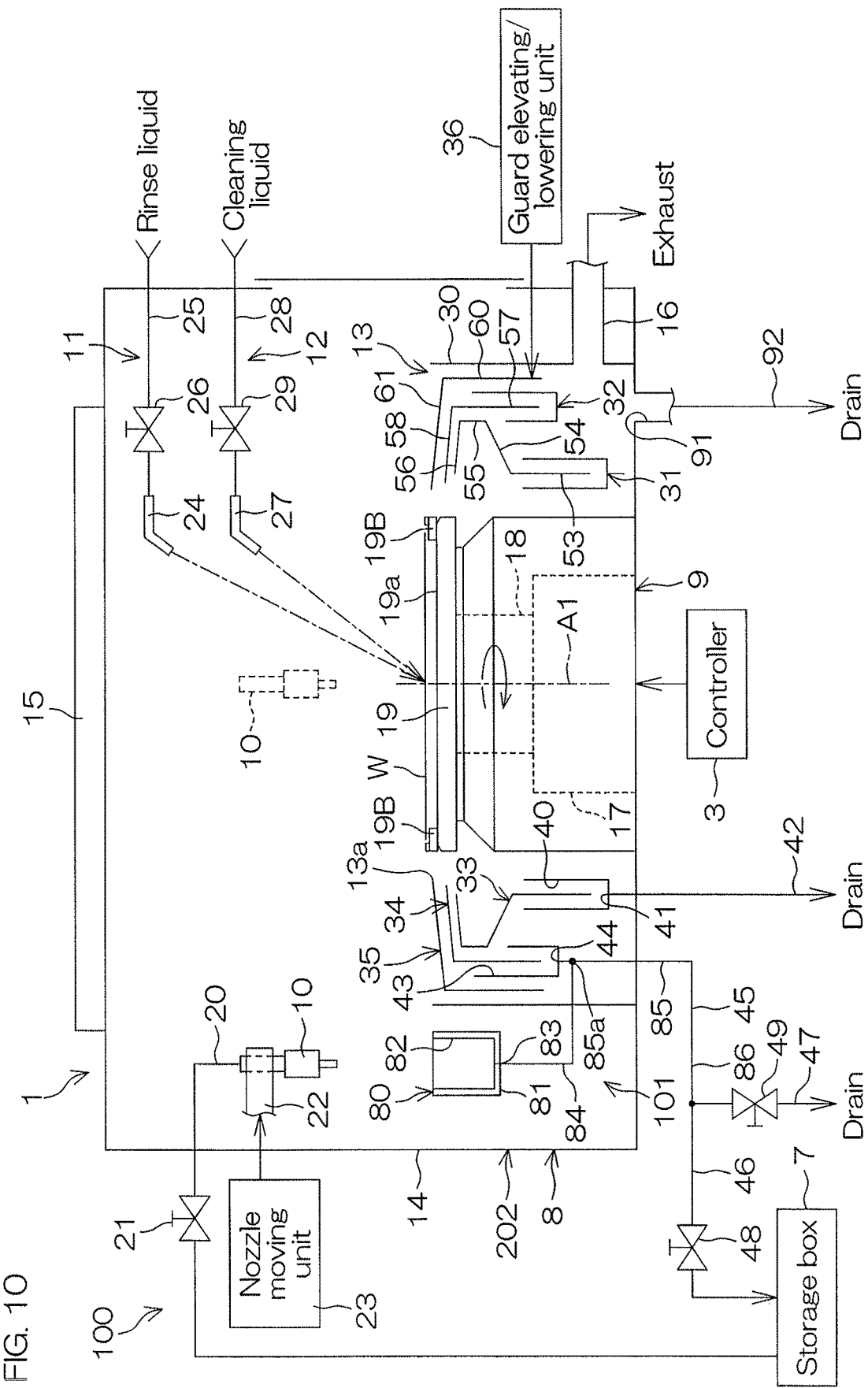
FIG. 10 is an illustrative sectional view for describing an arrangement example of a processing unit according to a second preferred embodiment of the present invention.

FIG. 10 is an illustrative sectional view for describing an arrangement example of a processing unit 202 according to a second preferred embodiment of the present invention.

In FIG. 10, portions corresponding to the respective portions indicated in the first preferred embodiment shall be indicated with the same reference symbols as in FIG. 1 to FIG. 9 and description thereof shall be omitted.

The processing unit 202 according to the second preferred embodiment is different from the processing unit 2 according to the first preferred embodiment in the point where the downstream end of the connection piping 84 is connected to an upstream end portion 85a of the up-down direction portion 85 (the upper end portion, the peripheral portion including an upstream end in the up-down direction portion 85, or the region of about 1/10 to 1/5 from the upstream end in the up-down direction portion 85). In this case, the chemical liquid discharged from the chemical liquid nozzle 10 set at the home position passes through the standby pot 80 and the connection piping 84 and is supplied into the upstream end portion 85a of the up-down direction portion 85.

In the present preferred embodiment, in addition to actions and effects equivalent to those of the first preferred embodiment described above, the following actions and effects are exhibited. That is, since the connection piping 84 is connected to the upstream end portion 85a of the up-down direction portion 85, the cleaning chemical liquid from the connection piping 84 can be supplied to the upstream end portion 85a of the up-down direction portion 85. Therefore, the cleaning chemical liquid can be dispersed over the entire region in the recovery piping 45. Thereby, the cleaning chemical liquid can be replaced over the entire region in the recovery piping 45. Therefore, it is possible to prevent or more effectively suppress entry of cleaning liquid into the chemical liquid recovery piping 46 after the start of the chemical liquid processing.

Figure 11:
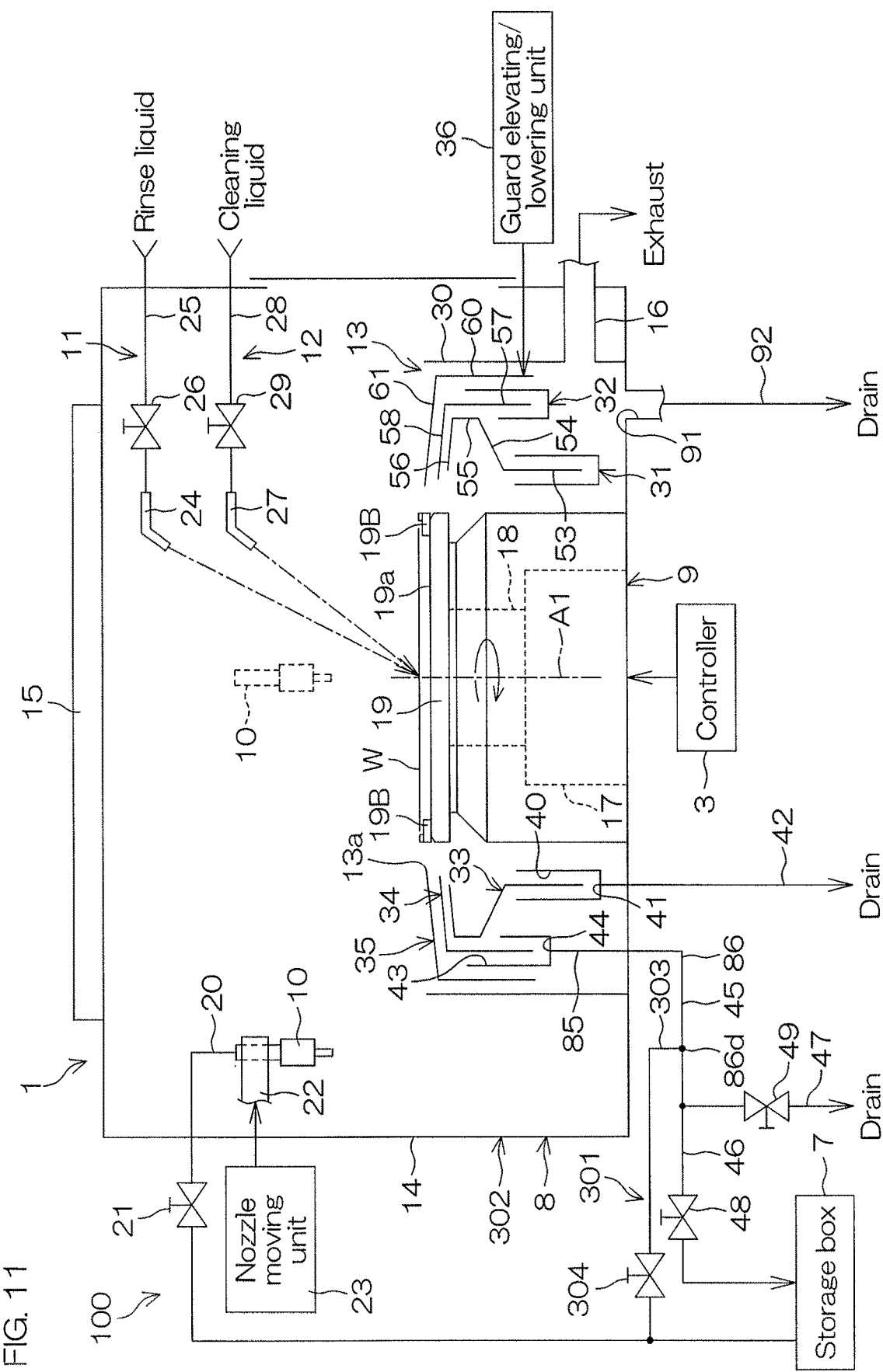
FIG. 11 is an illustrative sectional view for describing an arrangement example of a processing unit according to a third preferred embodiment of the present invention.

FIG. 11 is an illustrative sectional view for describing an arrangement example of a processing unit 302 according to a third preferred embodiment of the present invention.

In FIG. 11, portions corresponding to the respective portions indicated in the first preferred embodiment shall be indicated with the same reference symbols as in FIG. 1 to FIG. 9 and description thereof shall be omitted.

The processing unit 302 according to the third preferred embodiment is different from the processing unit 2 according to the first preferred embodiment in the point where the chemical liquid passes through a branching piping 303 branching from the chemical liquid piping 20 and is supplied to the recovery piping 45 as the cleaning chemical liquid. Specifically, an upstream end of the branching piping 303 is connected to and branches from each middle portion of the chemical liquid piping 20, and a downstream end of the branching piping 303 is connected to and branches from the connection position 86d in the lateral direction portion 86. An opening/closing valve 304 arranged to open and close the branching piping 303 is interposed in a middle portion of the branching piping 303. The opening/closing valve 304 is connected to the controller 3. That is, a cleaning chemical liquid supplying unit 301 according to the third preferred embodiment includes the chemical liquid supplying unit 100, the branching piping 303, and the opening/closing valve 304.

In the cleaning chemical liquid supplying step T11, when the cleaning chemical liquid is supplied to the recovery piping 45, the controller 3 opens the opening/closing valve 304. Thereby, the chemical liquid flowing through the chemical liquid piping 20 passes through the branching piping 303 and is supplied to the recovery piping 45.

In the present preferred embodiment, in addition to actions and effects equivalent to those of the first preferred embodiment described above, the following actions and effects are exhibited. That is, the chemical liquid from the chemical liquid piping 20 passes through the branching piping 303 branching from the chemical liquid piping 20 and is supplied to the recovery piping 45 as the cleaning chemical liquid. Thereby, the arrangement to directly supply the cleaning chemical liquid to the recovery piping 45 can be realized with a simple arrangement.

The three preferred embodiments of the present invention are described above. However, the present invention can further be implemented in yet other modes. Some modes included in the scope of the present invention will be listed below as examples.

For example, with the second preferred embodiment, the downstream end of the connection piping 84 may be connected to not the upstream end portion 85*a* of the up-down direction portion 85 but a middle portion of the up-down direction portion 85 (to a region away from an upper end of the up-down direction portion 85). In this case, the cleaning chemical liquid from the connection piping 84 is supplied to the middle portion of the up-down direction portion 85. Thus, the cleaning chemical liquid is dispersed over the entire region in the interior of a portion of the up-down direction portion 85 on the further downstream side than a connection position of the connection piping 84 and the lateral direction portion 86. Therefore, even in this case, the cleaning liquid existing in the recovery piping 45 can be replaced with the cleaning chemical liquid in a wide range in the recovery piping 45.

The second preferred embodiment and the third preferred embodiment may be combined. That is, the downstream end of the branching piping 303 may be connected to the upstream end portion 85*a* of the up-down direction portion 85. In this case, the actions and the effects relating to the second preferred embodiment and the actions and the effects relating to the third preferred embodiment are exerted.

In the preferred embodiments described above, the recovery valve 48 is closed and the drain valve 49 is opened (step T5 of FIG. 8) immediately before the discharge of the cleaning liquid is started (step T6 of FIG. 8). However, at any appropriate timing after (the sequence of) the cup cleaning processing is started and before the discharge of the cleaning liquid is started, the recovery valve 48 can be closed and the drain valve 49 can be opened.

In the preferred embodiments described above, the cleaning chemical liquid supplying step T11 is included in (the sequence of) the cup cleaning processing. However, the cleaning chemical liquid supplying step T11 may be executed separately from the cup cleaning processing.

Specifically, the cleaning chemical liquid supplying step T11 may be started not immediately after the end of the cup cleaning processing but at a timing when a predetermined period of time elapses. The cleaning chemical liquid supplying step T11 may be executed before the series of the chemical liquid processing is started.

For example, in the chemical liquid processing, in order to eject the chemical liquid in the chemical liquid nozzle 10 and the chemical liquid piping 20, the chemical liquid is, in some cases, discharged (pre-dispensed) from the chemical liquid nozzle 10 before the chemical liquid step (step S4 of FIG. 7) is started. At this time, the chemical liquid ejected from the chemical liquid nozzle 10 may be supplied to the recovery piping 45 as the cleaning chemical liquid via the standby pot 80 and the connection piping 84, and thereby, the cleaning liquid in the recovery piping 45 may be replaced with the cleaning chemical liquid. That is, in accordance with the pre-dispensing before the chemical liquid step (step S4 of FIG. 7) is started, the cleaning chemical liquid supplying step T11 is executed.

In each of the preferred embodiments described above, the cup cleaning step E1 is executed in a state where the dummy substrate DW is held by the spin chuck 9. However, the cup cleaning step E1 may be executed in a state where the substrate W is held by the spin chuck 9. In this case, in the cup cleaning step E1, the cleaning liquid is supplied to not the dummy substrate DW but the substrate W. In this case, the arrangement of the dummy substrate holding base 4 (see FIG. 1) can also be eliminated from the substrate processing apparatus 1.

In each of the preferred embodiments described above, the cup cleaning processing is executed every time the processing for one lot of the substrates W is ended. However, timing of implementing the cup cleaning can be appropriately set in accordance with a degree of dirtiness of the processing cup 13. For example, the cup cleaning processing may be executed before the processing for one lot is started, or the cup cleaning processing may be executed both before and after the processing for one lot is started. The timing is not limited to before and after the processing for one lot but the cup cleaning processing may be performed, for example, in a predetermined time zone in a day.

Further, cleaning of the interior of the chamber 8 (chamber cleaning) may be performed in parallel to execution of the cup cleaning processing. In this case, cleaning of the chemical liquid nozzle 10 and cleaning of other peripheral members may further be performed at the same time.

The cup cleaning processing may be performed not for the purpose of cleaning of the processing cup 13 but mainly for the purpose of cleaning of the interior of the recovery piping 45 (recovery piping cleaning).

BHF (buffered hydrogen fluoride) is shown as an example of the chemical liquid to be supplied to the substrate W from the chemical liquid supplying unit 100. However, in addition to BHF, a resist residue removing liquid such as SPM (sulfuric acid/hydrogen peroxide mixture) and organic solvents (NMP (N-methylpyrrolidone), etc.) is favorably used as the chemical liquid. Additionally, a cleaning chemical liquid such as SC1 (ammonia/hydrogen peroxide mixture) and etching solution can also be used as the chemical liquid.

With each of the preferred embodiments described above, the arrangement of the recovery tank 72 may be omitted and an arrangement where the chemical liquid recovered from the processing cup 13 is directly supplied to the chemical liquid tank 71 may be adopted.

With each of the preferred embodiments described above, the switching unit may be arranged not by two opening/closing valves (the recovery valve 48 and the drain valve 49) but by a three-way valve.

With each of the preferred embodiments, the chemical liquid recovery piping 46 may be provided in relation to not only the second groove 43 but also the first groove 40.

The processing cup 13 of three stages is described as an example. However, the processing cup 13 may be of a single stage (single cup) or two stages, or may even have multiple cups of four stages or more.

In each of the preferred embodiments described above, a case where the substrate processing apparatus 1 is an apparatus that processes disk-shaped substrates is described. However, the substrate processing apparatus 1 may be an apparatus that processes polygonal substrates such as glass substrates for liquid crystal display devices.

While the preferred embodiments of the present invention have been described in detail above, these are merely specific examples used to clarify the technical content of the present invention. The present invention should not be interpreted as being limited only to these specific examples and the scope of the present invention is limited only by the appended claims.

The present application corresponds to Japanese Patent Application No. 2016-187139 filed on Sep. 26, 2016 in the Japan Patent Office, and the entire disclosure of this application is incorporated herein by reference.

What is claimed is:

1. A substrate processing apparatus comprising:
a chemical liquid supplying unit including a chemical liquid nozzle connected to a chemical liquid tank, arranged to supply a chemical liquid to be used for processing of a substrate to the substrate;
a processing cup arranged to receive the chemical liquid supplied to the substrate;
a recovery piping into which the chemical liquid received by the processing cup is led, the recovery piping having one end connected to the processing cup and having another end;
a chemical liquid recovery piping connected to the other end of the recovery piping and arranged to recover the chemical liquid led into the recovery piping;
a drain piping connected to the other end of the recovery piping and arranged to drain a liquid led into the recovery piping;
a switching unit including valves arranged to lead the liquid led into the recovery piping selectively into the chemical liquid recovery piping and the drain piping;
a cleaning liquid supplying unit including a cleaning liquid nozzle connected to a cleaning liquid supply, arranged to supply a cleaning liquid for cleaning the interior of the recovery piping;
a cleaning chemical liquid supplying unit having a cleaning chemical liquid supply piping connected to a connect portion of the recovery piping positioned between the one end and the other end of the recovery piping, the cleaning chemical liquid supply piping being arranged to supply a cleaning chemical liquid of the same type as the chemical liquid to be recovered via the recovery piping to the recovery piping; and
a controller including a programmed computer, arranged to control the chemical liquid supplying unit, the cleaning chemical liquid supplying unit, the switching unit, and the cleaning liquid supplying unit, wherein
the controller executes:
a piping cleaning step of cleaning the interior of the recovery piping by using the cleaning liquid by, while supplying the cleaning liquid to the recovery piping, leading the liquid led into the recovery piping into the drain piping; and
a cleaning chemical liquid supplying step of, in order to replace the cleaning liquid existing in the recovery piping with the cleaning chemical liquid after the piping cleaning step, supplying the cleaning chemical liquid from the cleaning chemical liquid supply piping to the recovery piping while leading the liquid led into the recovery piping into the drain piping.

2. The substrate processing apparatus according to claim 1, wherein
the recovery piping has an up-down direction portion connected to the processing cup, the up-down direction portion extending along the up-down direction, and a lateral direction portion connected to a lower end of the up-down direction portion, the lateral direction portion extending along the lateral direction, and
the cleaning chemical liquid supply piping is connected to the lateral direction portion, and the cleaning chemical liquid supplying unit supplies the cleaning chemical liquid to the lateral direction portion.

3. The substrate processing apparatus according to claim 1, wherein
the recovery piping includes an up-down direction portion connected to the processing cup, the up-down direction portion extending along the up-down direction, and a lateral direction portion connected to a lower end of the up-down direction portion, the lateral direction portion extending along the lateral direction, and
the cleaning chemical liquid supply piping is connected to the up-down direction portion, and the cleaning chemical liquid supplying unit supplies the chemical liquid to the up-down direction portion.

4. The substrate processing apparatus according to claim 3, wherein
the up-down direction portion has an upper end portion, and
the cleaning chemical liquid supply piping is connected to the upper end portion of the up-down direction portion.

5. The substrate processing apparatus according to claim 1, wherein
the chemical liquid supplying unit includes a chemical liquid nozzle arranged to discharge the chemical liquid, and a chemical liquid piping arranged to supply the chemical liquid to the chemical liquid nozzle, and
the cleaning chemical liquid supply piping includes a branching piping connected to the recovery piping, the branching piping branching from the chemical liquid piping.

6. A substrate processing apparatus comprising:
a chemical liquid supplying unit including a chemical liquid nozzle connected to a chemical liquid tank, arranged to supply a chemical liquid to be used for processing of a substrate to the substrate, the chemical liquid supplying unit having a chemical liquid nozzle arranged to discharge the chemical liquid;
a processing cup arranged to receive the chemical liquid supplied to the substrate;
a container disposed out of the processing cup, the container being arranged to catch the chemical liquid discharged from the chemical liquid nozzle;
a recovery piping into which the chemical liquid received by the processing cup is led;
a chemical liquid recovery piping arranged to recover the chemical liquid led into the recovery piping;
a drain piping arranged to drain a liquid led into the recovery piping;
a switching unit including valves arranged to lead the liquid led into the recovery piping selectively into the chemical liquid recovery piping and the drain piping;
a cleaning liquid supplying unit including a cleaning liquid nozzle connected to a cleaning liquid supply, arranged to supply a cleaning liquid for cleaning the interior of the recovery piping;
a cleaning chemical liquid supplying unit having a cleaning chemical liquid supply piping connected to the recovery piping, the cleaning chemical liquid supply piping being arranged to supply a cleaning chemical liquid of the same type as the chemical liquid to be recovered via the recovery piping to the recovery piping; and
a controller including a programmed computer, arranged to control the chemical liquid supplying unit, the cleaning chemical liquid supplying unit, the switching unit, and the cleaning liquid supplying unit, wherein
the cleaning chemical liquid supply piping includes a connection piping connected to the recovery piping, the connection piping being arranged to supply the chemical liquid led into the container to the recovery piping as the cleaning chemical liquid, and
the controller executes:
a piping cleaning step of cleaning the interior of the recovery piping by using the cleaning liquid by, while supplying the cleaning liquid to the recovery piping, leading the liquid led into the recovery piping into the drain piping; and a cleaning chemical liquid supplying step of, in order to replace cleaning liquid existing in the recovery piping with the cleaning chemical liquid after the piping cleaning step, supplying the cleaning chemical liquid from the connection piping to the recovery piping while leading the liquid led into the recovery piping into the drain piping.

7. A substrate processing apparatus comprising:

a chemical liquid supplying unit including a chemical liquid nozzle connected to a chemical liquid tank, arranged to supply a chemical liquid to be used for processing of a substrate to the substrate;

a processing cup arranged to receive the chemical liquid supplied to the substrate;

a container disposed out of the processing cup, the container being arranged to catch chemical liquid discharged from the chemical liquid nozzle;

a recovery piping into which the chemical liquid received by the processing cup is led, the recovery piping having an up-down direction portion connected to the processing cup, the up-down direction portion extending along the up-down direction, and a lateral direction portion connected to a lower end of the up-down direction portion, the lateral direction portion extending along the lateral direction;

a connection piping connected to the up-down direction portion, the connection piping arranged to lead the chemical liquid led into the container into the up-down direction portion;

a chemical liquid recovery piping arranged to recover the chemical liquid led into the recovery piping;

a drain piping arranged to drain a liquid led into the recovery piping; and a switching unit including valves arranged to lead the liquid led into the recovery piping selectively into the chemical liquid recovery piping and the drain piping.

8. The substrate processing apparatus according to claim 7, wherein the up-down direction portion has an upper end portion, and the connection piping is connected to the upper end portion of the up-down direction portion.

\* \* \* \* \*